(12) United States Patent
Hashimoto et al.

(10) Patent No.: US 9,337,400 B2
(45) Date of Patent: May 10, 2016

(54) SEMICONDUCTOR LIGHT EMITTING ELEMENT AND METHOD FOR MANUFACTURING THE SAME

(71) Applicant: KABUSHIKI KAISHA TOSHIBA, Minato-ku (JP)

(72) Inventors: Rei Hashimoto, Tokyo (JP); Shigeya Kimura, Kanagawa-ken (JP); Jongil Hwang, Kanagawa-ken (JP); Hiroshi Katsuno, Tokyo (JP); Shinji Saito, Kanagawa-ken (JP); Shinya Nunoue, Chiba-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/734,532

(22) Filed: Jun. 9, 2015

(65) Prior Publication Data
US 2015/0325555 A1 Nov. 12, 2015

Related U.S. Application Data

(62) Division of application No. 14/176,272, filed on Feb. 10, 2014, now Pat. No. 9,202,994.

(30) Foreign Application Priority Data

Mar. 7, 2013 (JP) .................. 2013-046009

(51) Int. Cl.
*H01L 33/42* (2010.01)
*H01L 33/00* (2010.01)
(Continued)

(52) U.S. Cl.
CPC .......... *H01L 33/504* (2013.01); *H01L 25/0756* (2013.01); *H01L 33/0079* (2013.01); *H01L33/382* (2013.01); *H01L 33/405* (2013.01); *H01L 33/42* (2013.01); *H01L 33/60* (2013.01); *H01L 33/642* (2013.01); *H01L 2924/0002* (2013.01)

(58) Field of Classification Search
CPC ..... H01L 33/60; H01L 33/504; H01L 33/382; H01L 33/42; H01L 33/642; H01L 33/0079; H01L 2924/0002; H01L 33/405; H01L 25/0756
USPC .............................. 257/88; 438/27
See application file for complete search history.

(56) References Cited

U.S. PATENT DOCUMENTS

| 5,739,552 A | 4/1998 | Kimura et al. |
| 2003/0038295 A1 | 2/2003 | Koda |

(Continued)

FOREIGN PATENT DOCUMENTS

| JP | 08-213657 A | 8/1996 |
| JP | 2003-142737 A | 5/2003 |

(Continued)

OTHER PUBLICATIONS

Office Action and Search Report issued on May 11, 2015 in the counterpart Taiwanese patent Application No. 103104717 with English Translation).

*Primary Examiner* — Evan Pert
*Assistant Examiner* — Changhyun Yi
(74) *Attorney, Agent, or Firm* — Oblon, McClelland, Maier & Neustadt, L.L.P

(57) ABSTRACT

According to one embodiment, a semiconductor light emitting element includes a light reflecting layer, first second, third and fourth semiconductor layers, first and second light emitting layers, and a first light transmitting layer. The second semiconductor layer is provided between the first semiconductor layer and the light reflecting layer. The first light emitting layer is provided between the first and second semiconductor layers. The first light transmitting layer is provided between the second semiconductor layer and the light reflecting layer. The third semiconductor layer is provided between the first light transmitting layer and the light reflecting layer. The fourth semiconductor layer is provided between the third semiconductor layer and the light reflecting layer. The second light emitting layer is provided between the third and fourth semiconductor layers. The light reflecting layer is electrically connected to one selected from the third and fourth semiconductor layers.

18 Claims, 9 Drawing Sheets

(51) Int. Cl.
  *H01L 33/50* (2010.01)
  *H01L 33/38* (2010.01)
  *H01L 33/64* (2010.01)
  *H01L 33/60* (2010.01)
  *H01L 25/075* (2006.01)
  *H01L 33/40* (2010.01)

(56) References Cited

U.S. PATENT DOCUMENTS

2006/0027820 A1* 2/2006 Cao .................. H01L 27/15
                                            257/89
2008/0251799 A1  10/2008 Ikezawa
2010/0084668 A1   4/2010 Choi et al.
2011/0085144 A1   4/2011 Groetsch et al.
2012/0094414 A1*  4/2012 Or-Bach ............ H01L 27/15
                                            438/33
2012/0146045 A1   6/2012 Sugiyama et al.

FOREIGN PATENT DOCUMENTS

| JP | 2004-119634 A | 4/2004 |
| JP | 2008-263127 A | 10/2008 |
| JP | 2011-176045   | 9/2011 |
| JP | 2011-524994 A | 9/2011 |
| JP | 2012-504856 A | 2/2012 |

* cited by examiner

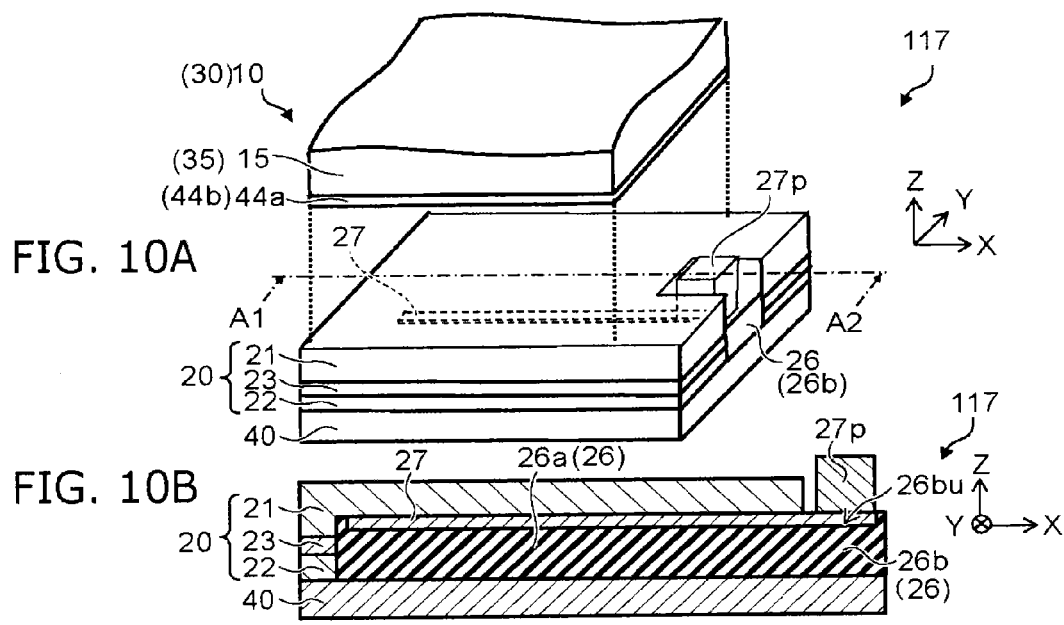
FIG. 10A
FIG. 10B
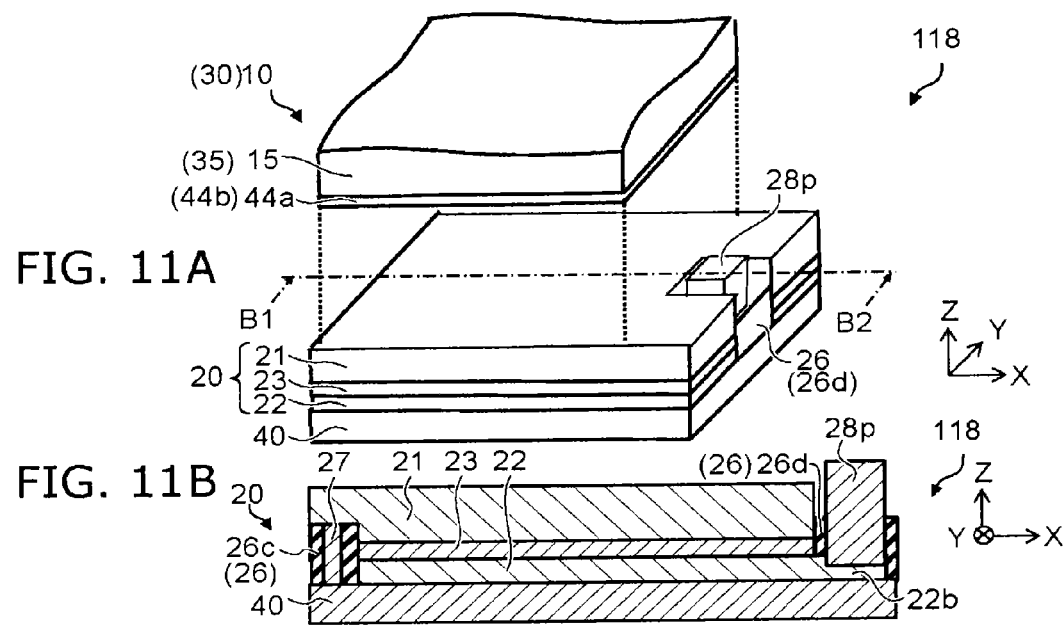
FIG. 11A
FIG. 11B

SEMICONDUCTOR LIGHT EMITTING ELEMENT AND METHOD FOR MANUFACTURING THE SAME

CROSS-REFERENCE TO RELATED APPLICATIONS

This divisional application is based upon and claims the benefit of priority under 35 U.S.C. §120 from U.S. patent application Ser. No. 14/176,272, filed Feb. 10, 2014, which claims the benefit of priority from prior Japanese Patent Application No. 2013-046009, filed on Mar. 7, 2013; the entire contents of which are incorporated herein by reference.

FIELD

Embodiments described herein relate generally to a semiconductor light emitting element and a method for manufacturing the same.

BACKGROUND

Semiconductor light emitting elements are applied to illumination and the like. For example, it is desirable to control the color of the light emitted from the semiconductor light emitting element to increase the color rendition of the illumination. It is desirable to realize a highly efficient and practical semiconductor light emitting element that can obtain light of a uniform color.

BRIEF DESCRIPTION OF THE DRAWINGS

FIG. 10A and FIG. 10B are schematic views illustrating another semiconductor light emitting element according to the first embodiment;

FIG. 11A and FIG. 11B are schematic views illustrating another semiconductor light emitting element according to the first embodiment;

DETAILED DESCRIPTION

Figure 1:
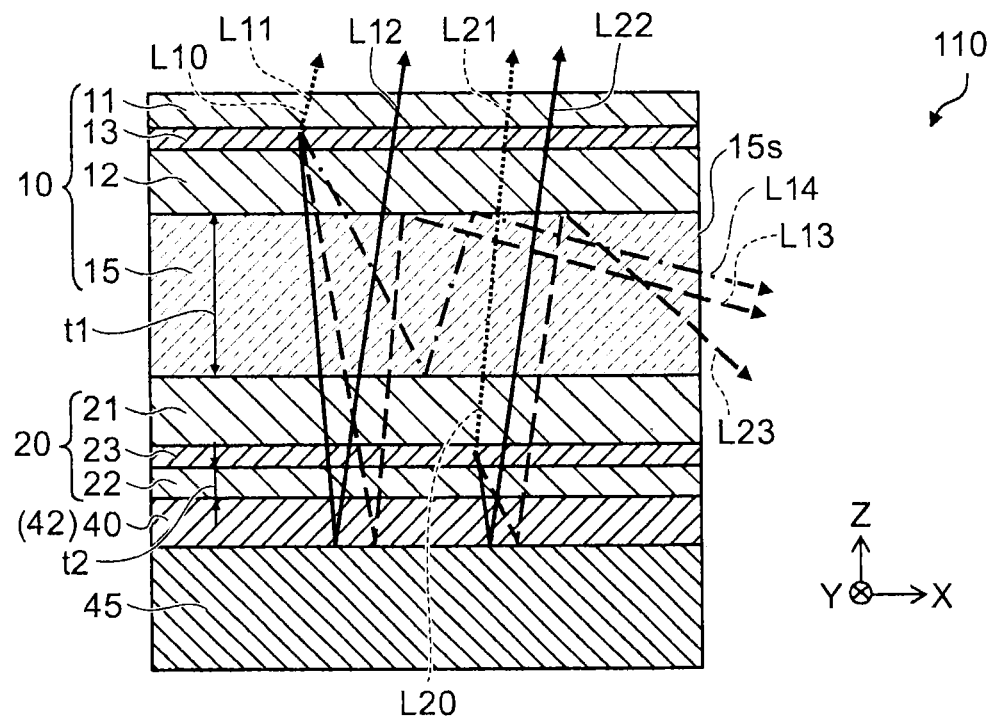
FIG. 1 is a schematic cross-sectional view illustrating a semiconductor light emitting element according to a first embodiment.

According to one embodiment, a semiconductor light emitting element includes a light reflecting layer, a first light emitting unit and a second light emitting unit. The first light emitting unit includes a first semiconductor layer, a second semiconductor layer, a first light emitting layer, a first light transmitting layer. The second light emitting unit includes a third semiconductor layer, a fourth semiconductor layer and a second light emitting layer. The second semiconductor layer is provided between the first semiconductor layer and the light reflecting layer, and a conductivity type of the second semiconductor layer is different from a conductivity type of the first semiconductor layer. The first light emitting layer is provided between the first semiconductor layer and the second semiconductor layer, and is configured to emit a first light of a first peak wavelength. The first light transmitting layer is provided between the second semiconductor layer and the light reflecting layer, and is light-transmissive to the first light. The third semiconductor layer is provided between the first light transmitting layer and the light reflecting layer. The fourth semiconductor layer is provided between the third semiconductor layer and the light reflecting layer, and a conductivity type of the fourth semiconductor layer is different from a conductivity type of the third semiconductor layer. The second light emitting layer is provided between the third semiconductor layer and the fourth semiconductor layer, and is configured to emit a second light of a second peak wavelength different from the first peak wavelength. The light reflecting layer is electrically connected to one selected from the third semiconductor layer and the fourth semiconductor layer. A thickness of the first light transmitting layer is not less than 10 times a distance between the second light emitting layer and the light reflecting layer.

According to one embodiment, a method is disclosed for manufacturing a semiconductor light emitting element, the element including a light reflecting layer, a first semiconductor layer, a second semiconductor layer, a first light emitting layer, a first light transmitting layer, a third semiconductor layer, a fourth semiconductor layer, and a second light emitting layer, the second semiconductor layer being provided between the first semiconductor layer and the light reflecting layer, a conductivity type of the second semiconductor layer being different from a conductivity type of the first semiconductor layer, the first light emitting layer being provided between the first semiconductor layer and the second semiconductor layer and being configured to emit a first light of a first peak wavelength, the first light transmitting layer being provided between the second semiconductor layer and the light reflecting layer and being light-transmissive to the first light, the third semiconductor layer being provided between the first light transmitting layer and the light reflecting layer, the fourth semiconductor layer being provided between the third semiconductor layer and the light reflecting layer, a conductivity type of the fourth semiconductor layer being different from a conductivity type of the third semiconductor layer, the second light emitting layer being provided between the third semiconductor layer and the fourth semiconductor layer and being configured to emit a second light of a second peak wavelength different from the first peak wavelength, the light reflecting layer being electrically connected to one selected from the third semiconductor layer and the fourth semiconductor layer, a thickness of the first light transmitting layer being not less than 10 times a distance between the second light emitting layer and the light reflecting layer. The method can include forming a structural body including the light reflecting layer and the second light emitting unit by sequentially performing crystal growth of the third semiconductor layer, the second light emitting layer, and the fourth semiconductor layer on a second light emitting unit growth substrate, by providing the light reflecting layer on the fourth semiconductor layer, and by removing the second light emitting unit growth substrate. The method can include disposing the first light emitting unit on the third semiconductor layer of the structural body, the first light emitting unit being formed by sequentially performing crystal growth of the second semiconductor layer, the first light emitting layer, and the first semiconductor layer on the first light transmitting layer.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a schematic cross-sectional view illustrating a semiconductor light emitting element according to a first embodiment.

As shown in FIG. 1, the semiconductor light emitting element 110 according to the embodiment includes a first light emitting unit 10, a second light emitting unit 20, a light reflecting layer 40, and a heat-dissipating member 45.

The light reflecting layer 40 is provided on the heat-dissipating member 45. The second light emitting unit 20 is provided on the light reflecting layer 40. The first light emitting unit 10 is provided on the second light emitting unit 20.

In the specification of the application, the "state of being provided on" includes the state of being disposed directly on and the state in which another component is inserted therebetween.

The first light emitting unit 10 includes a first semiconductor layer 11, a second semiconductor layer 12, a first light emitting layer 13, and a first light transmitting layer 15.

For example, the stacking direction from the light reflecting layer 40 toward the first semiconductor layer 11 is taken as a Z-axis direction. One direction perpendicular to the Z-axis direction is taken as an X-axis direction. A direction perpendicular to the Z-axis direction and the X-axis direction is taken as a Y-axis direction.

The first semiconductor layer 11 has a first conductivity type.

The second semiconductor layer 12 is provided between the first semiconductor layer 11 and the light reflecting layer 40. The second semiconductor layer 12 has a second conductivity type. The second conductivity type is different from the conductivity type (the first conductivity type) of the first semiconductor layer 11.

The first light emitting layer 13 is provided between the first semiconductor layer 11 and the second semiconductor layer 12. The first light emitting layer 13 emits a first light L10 of a first peak wavelength.

The first light transmitting layer 15 is provided between the second semiconductor layer 12 and the light reflecting layer 40. The first light transmitting layer 15 is light-transmissive to at least the first light L10. The first light transmitting layer 15 is, for example, insulative.

The second light emitting unit 20 includes a third semiconductor layer 21, a fourth semiconductor layer 22, and a second light emitting layer 23.

The third semiconductor layer 21 is provided between the first light transmitting layer 15 and the light reflecting layer 40. The third semiconductor layer 21 has a third conductivity type. The third conductivity type is one selected from the first conductivity type and the second conductivity type.

The fourth semiconductor layer 22 is provided between the third semiconductor layer 21 and the light reflecting layer 40. The fourth semiconductor layer 22 has a fourth conductivity type. The fourth conductivity type is different from the conductivity type (the third conductivity type) of the third semiconductor layer 21. The fourth conductivity type is the other selected from the first conductivity type and the second conductivity type.

The second light emitting layer 23 is provided between the third semiconductor layer 21 and the fourth semiconductor layer 22. The second light emitting layer 23 emits a second light L20 of a second peak wavelength. The second peak wavelength is different from the first peak wavelength.

The light reflecting layer 40 is, for example, electrically conductive. The light reflecting layer 40 is electrically connected to one selected from the third semiconductor layer 21 and the fourth semiconductor layer 22. The light reflecting layer 40 may function as an electrode.

In the example, the light reflecting layer 40 is electrically connected to the fourth semiconductor layer 22. The light reflecting layer 40 has an ohmic contact with the fourth semiconductor layer 22. In the case where the light reflecting layer 40 has a multilayered film structure, the film of the light reflecting layer 40 that contacts the fourth semiconductor layer 22 has an ohmic contact with the fourth semiconductor layer 22. In the case where the light reflecting layer 40 is electrically connected to the third semiconductor layer 21, the film of the light reflecting layer 40 that contacts the third semiconductor layer 21 has an ohmic contact with the third semiconductor layer 21.

The light reflecting layer 40 is disposed between the heat-dissipating member 45 and the second light emitting unit 20, that is, between the heat-dissipating member 45 and the fourth semiconductor layer 22. The heat-dissipating member 45 is thermally connected to the light reflecting layer 40. For example, the light reflecting layer 40 contacts the heat-dissipating member 45. Or, a thermally conductive layer (not shown) may be provided between the light reflecting layer 40 and the heat-dissipating member 45; and the thermally conductive layer may contact the light reflecting layer 40 and the heat-dissipating member 45. The thermal conductivity of the heat-dissipating member 45 is, for example, higher than the thermal conductivity of the first light transmitting layer 15. In the case where the thermally conductive layer is provided, the thermal conductivity of the thermally conductive layer is, for example, higher than the thermal conductivity of the first light transmitting layer 15.

The heat-dissipating member 45 is, for example, electrically conductive. The heat-dissipating member 45 may be electrically connected to the light reflecting layer 40 that is electrically conductive.

The semiconductor light emitting element 110 includes electrodes that are described below; and light is emitted by conducting a current to the first light emitting layer 13 and the second light emitting layer 23. The first light emitting unit 10 and the second light emitting unit 20 are, for example, LEDs (Light Emitting Diodes).

An example of optical paths of the semiconductor light emitting element 110 will now be described. In FIG. 1, the angles of the optical paths of the refractions and reflections may be illustrated differently from the actual state for easier viewing of the drawing.

A portion (a first component L11) of the first light L10 emitted from the first light emitting layer 13 is emitted to the outside by passing through the first semiconductor layer 11.

One other portion (a second component L12) of the first light L10 enters the second light emitting unit 20, is reflected by the light reflecting layer 40, returns to the first light emitting unit 10, passes through the first semiconductor layer 11, and is emitted to the outside. Another portion (a third component L13) of the first light L10 enters the second light emitting unit 20, is reflected by the light reflecting layer 40, propagates through the first light transmitting layer 15, and is emitted to the outside from a side surface 15s of the first light transmitting layer 15.

Yet another portion (a fourth component L14) of the first light L10 propagates through the first light transmitting layer 15 without entering the second light emitting unit 20 and is emitted to the outside from the side surface 15s of the first light transmitting layer 15. Thus, in the embodiment, a portion of the first light L10 is emitted from the side surface 15s of the first light transmitting layer 15.

On the other hand, a portion (a fifth component L21) of the second light L20 emitted from the second light emitting layer 23 is emitted to the outside by passing through the first light emitting unit 10 (e.g., the first semiconductor layer 11).

One other portion (a sixth component L22) of the second light L20 enters the fourth semiconductor layer 22, is reflected by the light reflecting layer 40, passes through the second light emitting unit 20 and the first light emitting unit 10 (the first semiconductor layer 11), and is emitted to the outside.

Another portion (a seventh component L23) of the second light L20 enters the fourth semiconductor layer 22, is reflected by the light reflecting layer 40, propagates through the first light transmitting layer 15, and is emitted to the outside from the side surface 15s of the first light transmitting layer 15.

The light of the semiconductor light emitting element 110 is emitted mainly from the first semiconductor layer 11 side. A portion of the light is emitted from the side surface 15s of the first light transmitting layer 15. The surface of the semiconductor light emitting element 110 on the first semiconductor layer 11 side is used as the light emitting surface.

In the embodiment, a thickness t1 of the first light transmitting layer 15 is thick. For example, the thickness t1 is not less than 10 times a distance t2 between the second light emitting layer 23 and the light reflecting layer 40. Further, the thickness t1 may be 50 times the distance t2 or more; or the thickness t1 may be 100 times the distance t2 or more.

For example, the thickness t1 is not less than 50 µm and not more than 250 µm. On the other hand, for example, the distance t2 is not less than 50 nm and not more than 500 nm. The distance t2 may be not less than 100 nm and not more than 200 nm. The thickness t1 and the distance t2 may be modified independently from each other. In such a case, in the embodiment, the thickness t1 is set to be 10 times the distance t2 or more. Further, the thickness t1 may be 50 times the distance t2 or more; or the thickness t1 may be 100 times the distance t2 or more.

In the embodiment, the proportion of the fourth component L14 can be increased by setting the thickness t1 of the first light transmitting layer 15 to be thick. The proportion of the second component L12 and the proportion of the third component L13 can be set to be low by setting the thickness t1 of the first light transmitting layer 15 to be thick.

The light of the second component L12 enters the second light emitting unit 20, is reflected by the light reflecting layer 40, and returns to the first light emitting unit 10. A portion of the light of the second component L12 is lost by being absorbed along the optical path. On the other hand, the light of the third component L13 enters the second light emitting unit 20, is reflected by the light reflecting layer 40, and enters the second light emitting unit 20. A portion of the light of the third component L13 is lost by being absorbed along the optical path.

In the embodiment, the loss can be reduced by reducing the proportion of the second component L12 and the proportion of the third component L13 by setting the thickness t1 of the first light transmitting layer 15 to be thick. Thereby, a highly efficient light emission is obtained.

Also, because the thickness t1 of the first light transmitting layer 15 is thick, the light of the fourth component L14 can be emitted to the outside from the side surface 15s of the first light transmitting layer 15 by propagating through the first light transmitting layer 15 while being subjected to few reflections. In other words, the absorption of the fourth component L14 as the fourth component L14 is guided through the first light transmitting layer 15 is suppressed. Thereby, the efficiency increases further.

Further, by setting the thickness t1 of the first light transmitting layer 15 to be thick, the seventh component L23 that is emitted from the second light emitting layer 23 can be emitted to the outside from the side surface 15s of the first light transmitting layer 15 while being subjected to few reflections. In other words, the absorption of the seventh component L23 as the seventh component L23 is guided through the first light transmitting layer 15 is suppressed. Thereby, the efficiency increases further.

Thus, in the embodiment, the first light L10 that is emitted from the first light emitting layer 13 and the second light L20 that is emitted from the second light emitting layer 23 can be extracted outside the element with high efficiency.

Then, any kind of light is obtained and high color rendition is obtained by adjusting the intensity of the first light L10 of the first light emitting layer 13 and the intensity of the second light L20 of the second light emitting layer 23.

On the other hand, in the embodiment, the distance t2 between the second light emitting layer 23 and the light reflecting layer 40 is short. The light reflecting layer 40 is thermally connected to the heat-dissipating member 45. By the distance t2 between the second light emitting layer 23 and the light reflecting layer 40 being short, for example, the heat that is generated at the second light emitting unit 20 is efficiently conducted to the heat-dissipating member 45 via the light reflecting layer 40. Thereby, the increase of the temperature of the second light emitting unit 20 can be suppressed; and the luminous efficiency of the second light emitting unit 20 (the second light emitting layer 23) increases.

On the other hand, a portion of the heat generated at the first light emitting unit 10 also is conducted efficiently to the heat-dissipating member 45 via the second light emitting unit 20 and via the light reflecting layer 40. Thereby, the increase of the temperature of the first light emitting unit 10 can be suppressed; and the luminous efficiency of the first light emitting unit 10 (the first light emitting layer 13) increases. The heat that is generated at the first light emitting unit 10 is conducted to the second light emitting unit 20. Because the distance t2 is short in the embodiment, the heat dissipation of the second light emitting unit 20 is high; and the heat that is conducted to the second light emitting unit 20 from the first light emitting unit 10 also is conducted efficiently to the heat-dissipating member 45.

On the other hand, there is a configuration of a reference example in which multiple LEDs that have mutually-different wavelength characteristics are arranged to obtain light of various colors. In other words, the LEDs are not stacked. In such a case, a phenomenon occurs in which the color changes according to the direction from which the light is emitted. This phenomenon is sometimes called "color breakup." In color breakup, for example, the color of the light changes between the direction perpendicular to a major surface (e.g., the light emitting surface) of the LED and an oblique direction. For example, the color changes between directions (e.g., directions in the X-Y plane) rotated around the direction perpendicular to the major surface. For example, the light is white in the frontward direction, bluish white in a rightward oblique direction, and yellowish white in an upward oblique direction. This is because the angle of the light from the LEDs changes when the direction rotates because the multiple LEDs are arranged.

In the embodiment, the first light emitting unit 10 and the second light emitting unit 20 that emit light of mutually-different wavelengths are stacked. Therefore, color breakup is suppressed. In other words, uniform polychromatic light that substantially does not depend on the direction is obtained.

Thus, according to the embodiment, highly efficient and uniform polychromatic light is obtained.

The first light transmitting layer 15 that is provided in the first light emitting unit 10 may include, for example, a sapphire substrate or a GaN substrate. For example, the second semiconductor layer 12, the first light emitting layer 13, and the first semiconductor layer 11 are formed by sequentially performing epitaxial growth on a sapphire substrate used to form the first light transmitting layer 15. This growth substrate may be used as the first light transmitting layer 15. For example, the first light emitting unit 10 is an LED having a face-up structure.

Such a first light emitting unit 10 is disposed on the second light emitting unit 20. The handling of the first light emitting unit 10 is easy because the first light emitting unit 10 has a configuration including the first light transmitting layer 15 (e.g., the sapphire substrate, etc.) that is thick. Therefore, the process of disposing the first light emitting unit 10 on the second light emitting unit 20 is easy; and high productivity is obtained.

On the other hand, the second light emitting unit 20 may include an LED having a thin film structure. In the second light emitting unit 20, for example, the third semiconductor layer 21, the second light emitting layer 23, and the fourth semiconductor layer 22 are formed by sequentially performing epitaxial growth on a not-shown growth substrate. Then, for example, after forming the light reflecting layer 40 on the surface of the fourth semiconductor layer 22, the growth substrate is removed. The removal of the growth substrate may be implemented after connecting the heat-dissipating member 45 to the light reflecting layer 40.

In the second light emitting unit 20, the growth substrate is removed after the third semiconductor layer 21, the second light emitting layer 23, and the fourth semiconductor layer 22 are formed by epitaxial growth. Thereby, the distance between the second light emitting unit 20 and the first light emitting unit 10 is shortened while shortening the distance t2 between the light reflecting layer 40 and the second light emitting layer 23 of the second light emitting unit 20. Thereby, high thermal conductivity is obtained.

At this time, the second light emitting unit 20 is bonded to at least the light reflecting layer 40. The light reflecting layer 40 functions as a support body that supports the second light emitting unit 20 that is thin. Further, for example, the heat-dissipating member 45 also functions as a support body that supports the second light emitting unit 20 that is thin. Thereby, the mechanical strength of the second light emitting unit 20 is high. Therefore, the stacking process of the second light emitting unit 20 and the first light emitting unit 10 can be implemented easily.

On the other hand, a reference example in which the first light emitting unit 10 has a thin film configuration also may be considered. In the thin film structure, a support body that supports the thin semiconductor layer is provided. In the case where a substrate (e.g., a silicon substrate, a metal substrate, etc.) having low light transmissivity is used as the support body, the light (the second light L20) of the second light emitting unit 20 cannot pass through the substrate.

Therefore, in the embodiment, a face-up structure in which a light-transmissive growth substrate can be used as the first light transmitting layer 15 is applied as the first light emitting unit 10. Thereby, the appropriate mechanical strength can be obtained and the manufacturing can be easy while obtaining the desired light extraction efficiency by causing the light of the second light emitting unit 20 to pass through the first light transmitting layer 15.

Thus, in the embodiment, the manufacturing processes are easy; and the practical usability is high. According to the embodiment, a highly efficient and practical semiconductor light emitting element that can obtain uniform polychromatic light can be provided.

For example, a reference example may be considered in which multiple LEDs having face-up structures are stacked. In such a case, for example, a growth substrate is provided also for the LED proximal to the heat-dissipating member 45. Good heat dissipation is not obtained because the growth substrate is thick.

Moreover, in the reference example in which the multiple LEDs having the face-up structures are stacked, it also may be considered to try to increase the light extraction efficiency by providing a special optical functional layer between the multiple LEDs. The optical functional layer transmits the light from the LED on the lower side and reflects the light from the LED on the upper side. There are more members (the optical functional layers) in such a configuration.

In the embodiment, the light can be extracted from the side surface 15s of the first light transmitting layer 15 and a high light extraction efficiency is obtained because the thickness t1 of the first light transmitting layer 15 provided between the first light emitting layer 13 and the light reflecting layer 40 on the upper side is set to be thick (not less than 10 times the distance t2). Simultaneously, a high heat dissipation efficiency is obtained by setting the distance t2 between the second light emitting layer 23 and the light reflecting layer 40 to be short (not more than of 1/10 of the thickness t1). Thus, in the embodiment, a special configuration is provided in which a high light extraction efficiency and a high heat dissipation efficiency are obtained.

In the embodiment, the second light L20 that is emitted from the second light emitting layer 23 is emitted mainly along the Z-axis direction (a direction perpendicular to the major surface of the light reflecting layer 40) because the distance t2 between the second light emitting layer 23 and the light reflecting layer 40 is short. The proportion of the Z-axis direction component of the second light L20 is higher than the proportion of the X-Y plane component of the second light L20. On the other hand, the angle of the spread of the first light L10 emitted from the first light emitting layer 13 is large because the thickness t1 of the first light transmitting layer 15 is thick and the distance between the first light emitting layer 13 and the light reflecting layer 40 is long. In other words, the directivity of the second light L20 is higher than the directivity of the first light L10. Thereby, the uniformity of the color of the synthesized light of the first light L10 and the second light L20 increases.

For example, the color changes greatly between the direction along the Z-axis direction and a direction having a large angle from the Z-axis direction in the case where the directivity of the light from the light emitting layer proximal to the light reflecting layer 40 is lower than the directivity of the light from the light emitting layer distal to the light reflecting layer 40.

In the embodiment, the directivity of the second light L20 can be set to be higher than the directivity of the first light L10; and thereby, the change of the color between the direction along the Z-axis direction and the direction having the large angle from the Z-axis direction is small.

In the embodiment, it is favorable for the thickness t1 of the first light transmitting layer 15 to be 1000 times the distance t2 between the second light emitting layer 23 and the light reflecting layer 40 or less. The thickness t1 may be 500 times the distance t2 or less. In the case where the thickness t1 of the first light transmitting layer 15, is excessively thick, the heat that is generated at the first light emitting layer 13 is not conducted easily to the light reflecting layer 40 via the first light transmitting layer 15. Therefore, the heat dissipation is poor. Good heat dissipation is obtained by setting the thickness t1 to be 1000 times the distance t2 or less. The heat dissipation improves further by setting the thickness t1 to be 500 times the distance t2 or less.

In the embodiment, it is favorable for the wavelength (the first peak wavelength) of the first light L10 emitted from the first light emitting layer 13 to be shorter than the wavelength (the second peak wavelength) of the second light L20 emitted from the second light emitting layer 23.

In the embodiment, a portion of the first light L10 passes through the second light emitting unit 20, is reflected by the light reflecting layer 40, and again passes through the second light emitting unit 20. In other words, a portion of the first light L10 passes through the second light L20 twice. Therefore, in the case where the absorptance of the second light emitting unit 20 for light of the wavelength of the first light L10 is high, the loss of the light becomes extremely large. On the other hand, a portion of the second light L20 passes through the first light emitting unit 10. The portion of the second light L20 passes through the first light emitting unit 10 once. Therefore, the effect on the efficiency of the portion of the second light L20 being absorbed at the first light emitting unit 10 is relatively small.

In the embodiment, for example, the first peak wavelength of the first light L10 is set to be shorter than the second peak wavelength of the second light. For example, the bandgap energy of the well layer included in the first light emitting layer 13 of the first light emitting unit 10 is set to be larger than the bandgap energy of the well layer included in the second light emitting layer 23 of the second light emitting unit 20. Thereby, the absorptance of the well layer included in the second light emitting layer 23 for the light of the wavelength of the first light L10 can be low. Thereby, the loss of the light can be suppressed; and the luminous efficiency can be increased.

Figure 2:
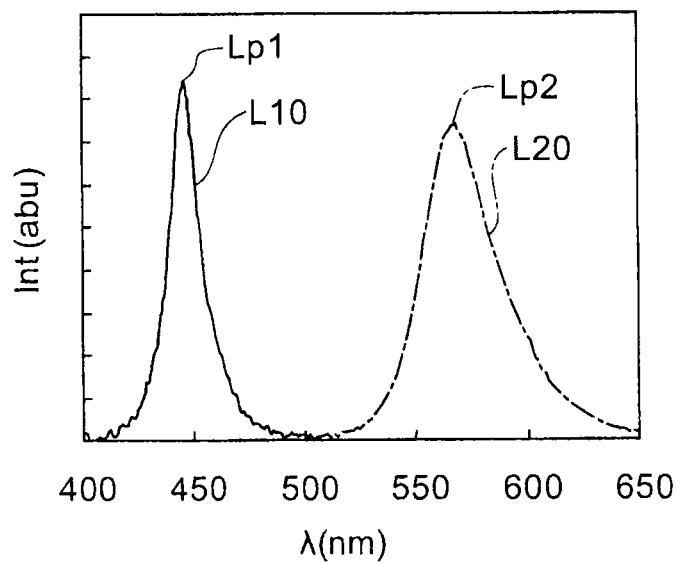
FIG. 2 is a graph illustrating characteristics of the semiconductor light emitting element according to the first embodiment.

FIG. 2 is a graph illustrating characteristics of the semiconductor light emitting element according to the first embodiment.

FIG. 2 shows spectra of the first light L10 and the second light L20. In FIG. 2, the horizontal axis is a wavelength ? (nanometers (nm)). The vertical axis is an intensity Int (arbitrary units) of the light.

As shown in FIG. 2, a first peak wavelength Lp1 of the first light L10 is about 440 nm. A second peak wavelength Lp2 of the second light L20 is about 560 nm. The first light L10 is blue light; and the second light L20 is yellow light. Substantially white light is obtained by mixing such a first light L10 and such a second light L20.

Although two light emitting units, i.e., two light emitting layers, are provided in the semiconductor light emitting element 110 recited above, the number of the light emitting units (the light emitting layers) may be three or more.

Figure 3:
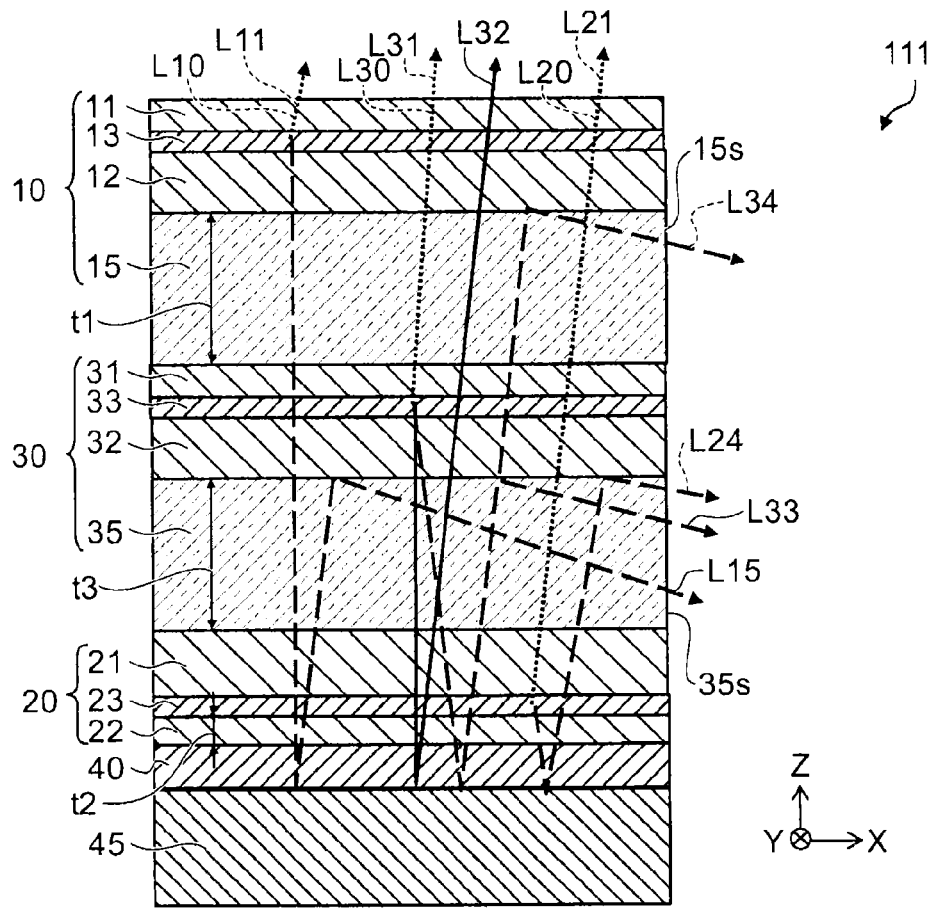
FIG. 3 is a schematic cross-sectional view illustrating another semiconductor light emitting element according to the first embodiment.

FIG. 3 is a schematic cross-sectional view illustrating another semiconductor light emitting element according to the first embodiment.

As shown in FIG. 3, the semiconductor light emitting element 111 according to the embodiment further includes a third light emitting unit 30 in addition to the first light emitting unit 10, the second light emitting unit 20, the light reflecting layer 40, and the heat-dissipating member 45. The third light emitting unit 30 is disposed between the first light emitting unit 10 and the second light emitting unit 20. The configurations described in regard to the semiconductor light emitting element 110 are applicable to the configurations of the first light emitting unit 10, the second light emitting unit 20, the light reflecting layer 40, and the heat-dissipating member 45 of the semiconductor light emitting element 111. The third light emitting unit 30 will now be described.

The third light emitting unit 30 includes a fifth semiconductor layer 31, a sixth semiconductor layer 32, a third light emitting layer 33, and a second light transmitting layer 35.

The fifth semiconductor layer 31 is provided between the first light transmitting layer 15 and the third semiconductor layer 21. The fifth semiconductor layer 31 has a fifth conductivity type. The fifth conductivity type is one selected from the first conductivity type and the second conductivity type.

The sixth semiconductor layer 32 is provided between the fifth semiconductor layer 31 and the third semiconductor layer 21. The sixth semiconductor layer 32 has a sixth conductivity type. The sixth conductivity type is different from the conductivity type (the fifth conductivity type) of the fifth semiconductor layer 31. The sixth conductivity type is the other selected from the first conductivity type and the second conductivity type.

The third light emitting layer 33 is provided between the fifth semiconductor layer 31 and the sixth semiconductor layer 32. The third light emitting layer 33 emits a third light L30 of a third peak wavelength. The third peak wavelength is different from the first peak wavelength and different from the second peak wavelength.

The second light transmitting layer 35 is provided between the sixth semiconductor layer 32 and the third semiconductor layer 21. The second light transmitting layer 35 is light-transmissive to at least the third light L30.

The thickness of the second light transmitting layer 35 is set to be thick. The thickness t3 of the second light transmitting layer 35 is not less than 10 times the distance t2 between the second light emitting layer 23 and the light reflecting layer 40. Further, the thickness t3 may be 50 times the distance t2 or more; or the thickness t3 may be 100 times the distance t2 or more.

Even in such a case, a sapphire substrate or a GaN substrate can be used as the second light transmitting layer 35. In other words, for example, the sixth semiconductor layer 32, the third light emitting layer 33, and the fifth semiconductor layer 31 that are included in the third light emitting unit 30 are formed by sequentially performing epitaxial growth on a substrate of sapphire, etc. This growth substrate is used as the second light transmitting layer 35. An LED having a face-up structure can be used as the third light emitting unit 30.

Even in such a case, a portion of the third light L30 is emitted from a side surface 35s of the second light transmitting layer 35. For example, light L31, which is a portion of the third light L30, is emitted to the outside by passing through the first light emitting unit 10 (the first semiconductor layer 11).

Light L32, which is one other portion of the third light L30, passes through the second light transmitting layer 35 and the second light emitting unit 20, is reflected by the light reflecting layer 40, passes through the second light emitting unit 20, the third light emitting unit 30, and the first light emitting unit 10 (the first semiconductor layer 11), and is emitted to the outside.

Light L33, which is another portion of the third light L30, passes through the second light transmitting layer 35 and the second light emitting unit 20, is reflected by the light reflecting layer 40, passes through the second light emitting unit 20, subsequently propagates through the second light transmitting layer 35, and is emitted to the outside from the side surface 35s of the second light transmitting layer 35.

Light L34, which is yet another portion of the third light L30, passes through the second light transmitting layer 35 and the second light emitting unit 20, is reflected by the light reflecting layer 40, passes through the second light emitting unit 20 and the third light emitting unit 30, subsequently propagates through the first light transmitting layer 15, and is emitted to the outside from the side surface 15s of the first light transmitting layer 15.

On the other hand, a portion of the first light L10 and a portion of the second light L20 also can be emitted from the side surface 35s of the second light transmitting layer 35.

For example, light L15, which is a portion of the first light L10, can be emitted to the outside from the side surface 35s of the second light transmitting layer 35 by passing through the third light emitting unit 30 and the second light emitting unit 20, being reflected by the light reflecting layer 40, passing through the second light emitting unit 20, and subsequently propagating through the second light transmitting layer 35. For example, light L24, which is a portion of the second light L20, can be emitted to the outside from the side surface 35s of the second light transmitting layer 35 by passing through the fourth semiconductor layer 22, being reflected by the light reflecting layer 40, passing through the second light emitting unit 20, and subsequently propagating through the second light transmitting layer 35.

Similarly to the semiconductor light emitting element 110, the light of a portion of the first light L10 can be emitted to the outside from the side surface 15s of the first light transmitting layer 15 in the semiconductor light emitting element 111. Also, the light of a portion of the second light L20 can be emitted to the outside from the side surface 15s of the first light transmitting layer 15.

In the semiconductor light emitting element 111 as well, similarly to the semiconductor light emitting element 110, a high light extraction efficiency effect and high thermal conductivity are obtained. Also, the occurrence of color breakup can be suppressed; and uniform polychromatic light is obtained. Further, the manufacturing is easier and practical because the crystal growth substrate is used as the second light transmitting layer 35 of the third light emitting unit 30 and a face-up structure is applied.

In the semiconductor light emitting element 111 as well, a highly efficient and practical semiconductor light emitting element that can obtain uniform polychromatic light can be provided.

In the semiconductor light emitting element 111, it is favorable for the thickness t3 of the second light transmitting layer 35 to be 1000 times the distance t2 between the second light emitting layer 23 and the light reflecting layer 40 or less. It is more favorable for the thickness t3 to be 500 times the distance t2 or less. Thereby, good heat dissipation is obtained.

In the semiconductor light emitting element 111, the controllability of the color increases because three light emitting units (light emitting layers) are provided. Higher color rendition is obtained.

In the semiconductor light emitting element 111, it is favorable for the third peak wavelength of the third light L30 to be set to be between the first peak wavelength of the first light L10 and the second peak wavelength of the second light L20. Thereby, the absorption of the light can be suppressed; and a higher luminous efficiency is obtained.

Figure 4:
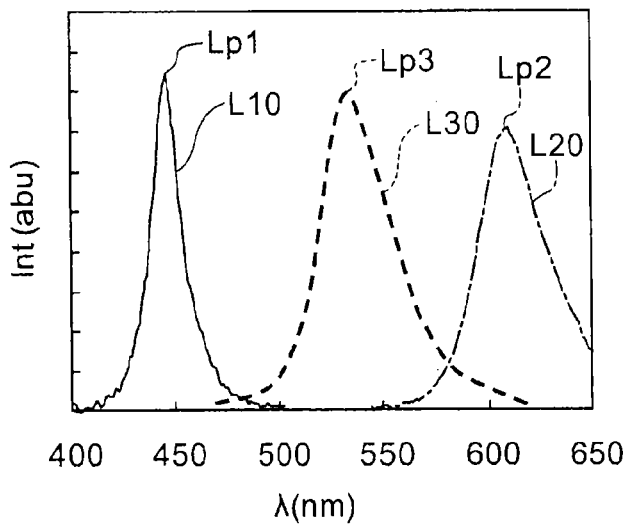
FIG. 4 is a graph illustrating characteristics of another semiconductor light emitting element according to the first embodiment.

FIG. 4 is a graph illustrating characteristics of another semiconductor light emitting element according to the first embodiment. FIG. 4 shows spectra of the first light L10, the second light L20, and the third light L30. In FIG. 4, the horizontal axis is the wavelength $\lambda$; and the vertical axis is the intensity Int of the light.

As shown in FIG. 4, the first peak wavelength Lp1 of the first light L10 is about 450 nm. The second peak wavelength Lp2 of the second light L20 is about 630 nm. A third peak wavelength Lp3 of the third light L30 is about 530 nm. The first light L10 is blue light; the second light L20 is red light; and the third light L30 is green light.

The first light L10 is light of the blue wavelength band. The first light L10 has a wavelength of, for example, less than 495 nm and not less than 400 nm.

The second light L20 is light of the red wavelength band. The second light L20 has a wavelength of, for example, not less than 570 nm and not more than 750 nm.

The third light L30 is light of the green wavelength band. The third light L30 has a wavelength of, for example, less than 570 nm and not less than 495 nm.

Four or more light emitting units may be stacked in the embodiment. For example, a fourth light emitting unit may be provided between the third light emitting unit 30 and the second light emitting unit 20.

The first conductivity type of the first semiconductor layer 11 is, for example, the p-type; and the second conductivity type of the second semiconductor layer 12 is, for example, the n-type. The first conductivity type may be the n-type; and the second conductivity type may be the p-type. Hereinbelow, the first conductivity type is taken to be the p-type; and the second conductivity type is taken to be the n-type.

The third conductivity type of the third semiconductor layer 21 is, for example, the n-type; and the fourth conductivity type of the fourth semiconductor layer 22 is, for example, the p-type. The third conductivity type may be the p-type; and the fourth conductivity type may be the ntype. Hereinbelow, the third conductivity type is taken to be the n-type; and the fourth conductivity type is taken to be the p-type.

The fifth conductivity type of the fifth semiconductor layer 31 is, for example, the p-type; and the sixth conductivity type of the sixth semiconductor layer 32 is, for example, the n-type. The fifth conductivity type may be the n-type; and the sixth conductivity type may be the p-type. Hereinbelow, the fifth conductivity type is taken to be the p-type; and the sixth conductivity type is taken to be the n-type.

Figure 5:
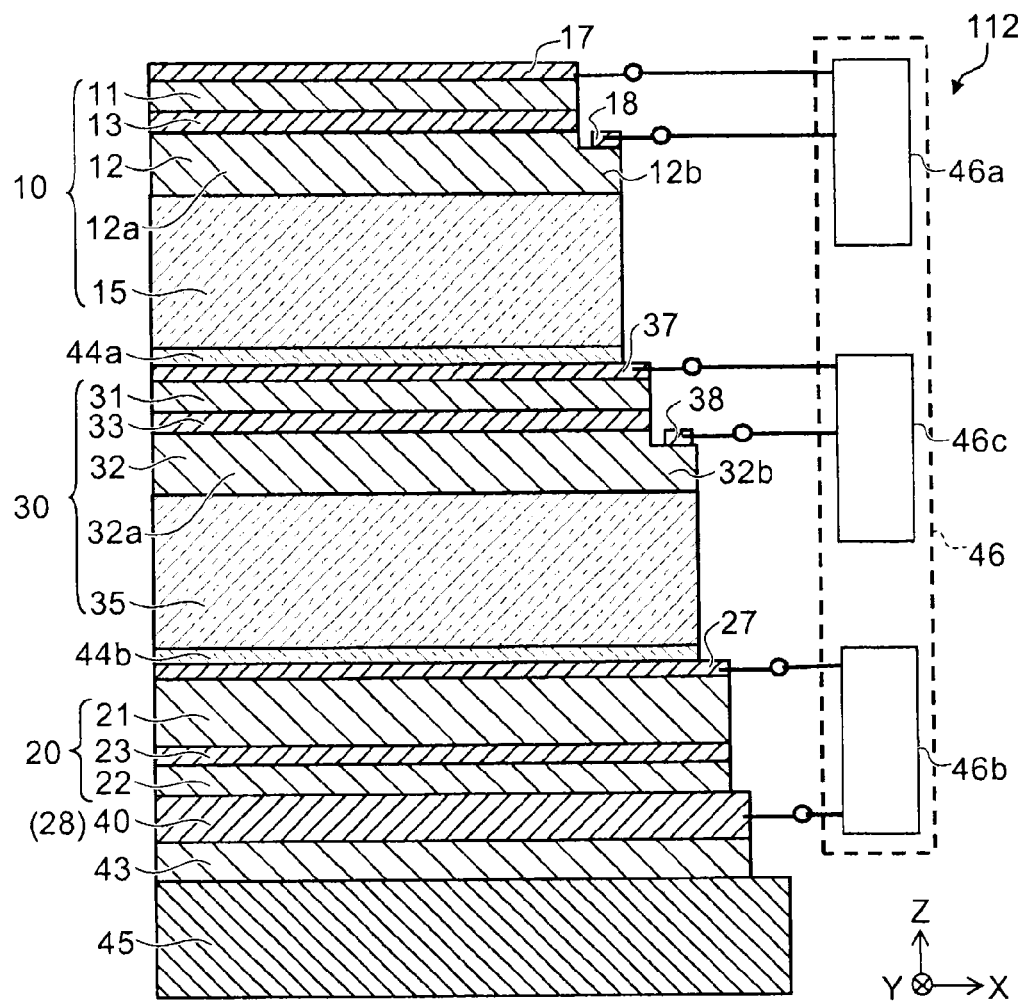
FIG. 5 is a schematic cross-sectional view illustrating another semiconductor light emitting element according to the first embodiment.

FIG. 5 is a schematic cross-sectional view illustrating another semiconductor light emitting element according to the first embodiment.

In the semiconductor light emitting element 112 according to the embodiment as shown in FIG. 5, the first light emitting unit 10 further includes a first semiconductor-layer side electrode 17 and a second semiconductor-layer side electrode 18. The first semiconductor layer 11 is disposed between the first semiconductor-layer side electrode 17 and the first light emitting layer 13. The first semiconductor-layer side electrode 17 is electrically connected to the first semiconductor layer 11. The second semiconductor-layer side electrode 18 is electrically connected to the second semiconductor layer 12.

For example, the second semiconductor layer 12 has a first portion 12a and a second portion 12b. The second portion 12b is arranged with the first portion 12a along a direction intersecting the Z-axis direction (the stacking direction from the light reflecting layer 40 toward the first semiconductor layer 11). For example, the second portion 12b is arranged with the first portion 12a in the X-Y plane.

The first semiconductor layer 11 is disposed between the first portion 12a of the second semiconductor layer 12 and the first semiconductor-layer side electrode 17. The first light emitting layer 13 is disposed between the first portion 12a and the first semiconductor layer 11. The second semiconductor-layer side electrode 18 is provided on the second portion 12b of the second semiconductor layer 12.

The first semiconductor-layer side electrode 17 is, for example, light-transmissive. The second semiconductor-layer side electrode 18 may be light-transmissive, light-reflective, or light-blocking.

The second light emitting unit 20 further includes a third semiconductor-layer side electrode 27. In the example, the third semiconductor layer 21 is disposed between the third semiconductor-layer side electrode 27 and the second light emitting unit 20. The third semiconductor-layer side electrode 27 is electrically connected to the third semiconductor layer 21. The third semiconductor-layer side electrode 27 is, for example, light-transmissive.

In the example, the light reflecting layer 40 is electrically connected to the fourth semiconductor layer 22. In other words, the light reflecting layer 40 functions as a fourth semiconductor-layer side electrode 28.

The third light emitting unit 30 further includes a fifth semiconductor-layer side electrode 37 and a sixth semiconductor-layer side electrode 38. The fifth semiconductor layer 31 is disposed between the fifth semiconductor-layer side electrode 37 and the third light emitting layer 33. The fifth semiconductor-layer side electrode 37 is electrically connected to the fifth semiconductor layer 31. The sixth semiconductor-layer side electrode 38 is electrically connected to the sixth semiconductor layer 32.

For example, the sixth semiconductor layer 32 has a third portion 32a and a fourth portion 32b. The fourth portion 32b is arranged with the third portion 32a along a direction intersecting the Z-axis direction. For example, the fourth portion 32b is arranged with the third portion 32a in the X-Y plane.

The fifth semiconductor layer 31 is disposed between the third portion 32a of the sixth semiconductor layer 32 and the fifth semiconductor-layer side electrode 37. The third light emitting layer 33 is disposed between the third portion 32a and the fifth semiconductor layer 31. The sixth semiconductor-layer side electrode 38 is provided on the fourth portion 32b of the sixth semiconductor layer 32.

The fifth semiconductor-layer side electrode 37 is, for example, light-transmissive. The sixth semiconductor-layer side electrode 38 may be light-transmissive, light-reflective, or light-blocking.

The first semiconductor-layer side electrode 17, the third semiconductor-layer side electrode 27, and the fifth semiconductor-layer side electrode 37 may include an oxide including at least one element selected from the group consisting of In, Sn, Zn, and Ti. These light-transmissive electrodes may include, for example, indium oxide (ITO) films. The thickness of these electrodes is, for example, not less than 0.1 μm and not more than 0.4 μm, e.g., about 0.2 μm. A high transmittance and a low electrical resistance are obtained by using such materials and thicknesses.

The second semiconductor-layer side electrode 18 and the sixth semiconductor-layer side electrode 38 include, for example, stacked films of Ti/Pt/Au. In such stacked films, for example, a Pt film is provided between a Au film and a semiconductor layer. A Ti film is provided between the Pt film and the semiconductor layer.

The light reflecting layer 40 includes, for example, a reflective metal layer 41 that has an ohmic contact with the fourth semiconductor layer 22. The reflective metal layer 41 includes at least one selected from Ag (silver), Al (aluminum), and rhodium (Rh). For example, the light reflecting layer 40 may include at least one selected from Ag, Al, and rhodium. The light reflecting layer 40 may include, for example, a stacked film including at least one film selected from a Ag film, an Al film, and a Rh film. As described below, a stacked film of a light transmitting film and a light reflecting film may be used as the light reflecting layer 40.

A drive unit 46 is connected to these electrodes. In the example, the drive unit 46 includes first to third drive circuits 46a to 46c. The first drive circuit 46a is connected to the first semiconductor-layer side electrode 17 and the second semiconductor-layer side electrode 18. The second drive circuit 46b is connected to the third semiconductor-layer side electrode 27 and the light reflecting layer 40 (the fourth semiconductor-layer side electrode 28). The third drive circuit 46c is connected to the fifth semiconductor-layer side electrode 37 and the sixth semiconductor-layer side electrode 38.

For example, the first to third drive circuits 46a to 46c apply voltages to the electrodes respectively connected to the first to third drive circuits 46a to 46c. The voltages are changeable independently from each other. Thereby, the intensity of the light emitted can be changed independently for the first light emitting layer 13, the second light emitting layer 23, and the third light emitting layer 33. Thereby, light of the desired color is obtained.

For example, bonding wires are used as the connection between the first drive circuit 46a and the first semiconductor-layer side electrode 17 and the connection between the first drive circuit 46a and the second semiconductor-layer side electrode 18. For example, bonding wires are used as the connection between the third drive circuit 46c and the fifth semiconductor-layer side electrode 37 and the connection between the third drive circuit 46c and the sixth semiconductor-layer side electrode 38. Any method can be used as the connection between the second drive circuit 46b and the third semiconductor-layer side electrode 27 and the connection between the second drive circuit 46b and the light reflecting layer 40 (the fourth semiconductor-layer side electrode 28). Bonding wires may be used for these connections.

The conductors (including wires and/or interconnect layers) that respectively connect the electrodes recited above to the drive circuits may be shared. For example, one of the multiple conductors connected to the first drive circuit 46a may be connected to the third drive circuit 46c. For example, one of the multiple conductors connected to the second drive circuit 46b may be connected to the third drive circuit 46c.

The semiconductor light emitting element 112 further includes a support layer 43. The light reflecting layer 40 is disposed between the support layer 43 and the fourth semiconductor layer 22. The support layer 43 includes, for example, a Si substrate, etc. A metal layer (e.g., a Cu layer), etc., may be used as the support layer 43. The support layer 43 is bonded to the light reflecting layer 40. The support layer 43 supports the light reflecting layer 40, the fourth semiconductor layer 22, the second light emitting layer 23, and the third semiconductor layer 21. That is, the light reflecting layer 43 is provided between the support layer 43 and the second semiconductor layer 20. For example, a thermal conductivity of the support layer 43 is higher than a thermal conductivity of the first light transmitting layer 15.

The heat-dissipating member 45 may include, for example, a package made of AlN, etc. The heat-dissipating member 45 may include a metal.

The heat generated at the light emitting unit is conducted efficiently to the heat-dissipating member 45 via the light reflecting layer 40 and the support layer 43.

According to the semiconductor light emitting element 112 as well, a highly efficient and practical semiconductor light emitting element that can obtain uniform polychromatic light can be provided.

The semiconductor light emitting element according to the embodiment can emit multicolored light. The light reflecting layer 40 and multiple light emitting units having mutually-different wavelengths are provided in the semiconductor light emitting element. The light reflecting layer 40 is disposed at the back surface on the side opposite to the light emitting surface. The multiple light emitting units are stacked on the light reflecting layer 40. The heat-dissipating member 45 is provided under the light reflecting layer 40.

The second light emitting unit 20 that is most proximal to the heat-dissipating member 45 includes, for example, a red LED (having a wavelength of about 630 nm). The second light emitting unit 20 includes, for example, an LED having a thin film structure. The light reflecting layer 40 is provided between the heat-dissipating member 45 and the fourth semiconductor layer 22 of the second light emitting unit 20. The light reflecting layer 40 includes, for example, a Ag film. The support layer 43 of Si, a metal, etc., may be provided between the light reflecting layer 40 and the heat-dissipating member 45. The second light emitting unit 20 has a vertical-conduction electrode structure. The red light that is emitted from the second light emitting unit 20 travels mainly upward.

The third light emitting unit 30 is provided on the second light emitting unit 20 that is red. The third light emitting unit 30 includes a green LED (having a wavelength of about 530 nm). The second light transmitting layer 35 of the third light emitting unit 30 includes, for example, a sapphire substrate. The third light emitting unit 30 is substantially transparent.

The red light that is irradiated from below can pass through the third light emitting unit 30 without a large loss. The second light transmitting layer 35 (the sapphire substrate) is insulative; and electrical independence from the second light emitting unit 20 under the second light transmitting layer 35 can be maintained.

The first light emitting unit 10 is provided on the third light emitting unit 30 that is green. The first light emitting unit 10 includes a blue LED (having a wavelength of about 450 nm). The first light transmitting layer 15 of the first light emitting unit 10 also includes, for example, a sapphire substrate. The first light emitting unit 10 also is substantially transparent. The red light and the green light that are irradiated from below can pass through the first light emitting unit 10 without a large loss. The first light transmitting layer 15 (the sapphire substrate) is insulative; and electrical independence from the third light emitting unit 30 under the first light transmitting layer 15 can be maintained.

These light emitting units may be bonded to each other by, for example, bonding layers that are light-transmissive. For example, a first bonding layer 44a may be provided between the first light emitting unit 10 and the third light emitting unit 30. A second bonding layer 44b may be provided between the third light emitting unit 30 and the second light emitting unit 20. At least one selected from the first bonding layer 44a and the second bonding layer 44b may include, for example, an organic film that is insulative, an inorganic film (e.g., a silicon oxide film) that is insulative, an inorganic film (e.g., an ITO film) that is electrically conductive, etc. At least one selected from the first bonding layer 44a and the second bonding layer 44b may include, for example, a silicone film.

In the semiconductor light emitting element according to the embodiment, a diffuser plate or the like for improving color breakup is omissible because the color breakup is suppressed. Further, because light of the desired color (white) is obtained without using a fluorescer, there is no Stokes shift loss; and a high luminous efficiency is obtained. Further, light of the desired color is obtained because the multiple light emitting units can be driven independently. The element can be smaller because the multiple light emitting units are stacked.

In the embodiment, the semiconductor layers and the light emitting layers may include, for example, a nitride semiconductor. For example, the semiconductor layers may include GaN. An impurity is appropriately added to the semiconductor layers to provide the semiconductor layers with conductivity types.

In the case where the nitride semiconductor is used, the n-type impurity includes, for example, at least one selected from Si, Ge, and Sn. The p-type impurity includes, for example, at least one selected from Mg and Zn.

The light emitting layer includes a well layer and a barrier layer stacked with the well layer along the Z-axis direction. The well layer includes, for example, $Al_{x1}In_{y1}Ga_{1-x1-y1}N$ ($0 \leq x1 < 1$ and $0 < y1 < 1$). The barrier layer includes, for example, $Al_{x2}In_{y2}Ga_{1-x2-y2}N$ ($0 \leq x2 < 1$, $0 \leq y2 < 1$, and $y2 < y1$), etc. The bandgap energy of the barrier layer is greater than the bandgap energy of the well layer.

For example, the In composition ratio of the well layer included in the first light emitting layer 13 is lower than the In composition ratio of the well layer included in the second light emitting layer 23. For example, the In composition ratio of the well layer included in the first light emitting layer 13 is lower than the In composition ratio of the well layer included in the third light emitting layer 33. For example, the In composition ratio of the well layer included in the third light emitting layer 33 is lower than the In composition ratio of the well layer included in the second light emitting layer 23.

The light emitting layers may have single quantum well (SQW) configurations. Or, the light emitting layers may have multiple quantum well (MQW) configurations.

These nitride semiconductor layers are formed by epitaxial growth on a growth substrate (e.g., a sapphire substrate or a GaN substrate). For example, metal-organic chemical vapor deposition (MOCVD), metal-organic vapor phase epitaxy (MOVPE), molecular beam epitaxy (MBE), hydride vapor phase epitaxy (HVPE), etc., may be used to perform the crystal growth.

For example, in the case where MOCVD or MOVPE is used, the following source materials may be used when forming the semiconductor layers. For example, TMGa (tri-methyl gallium) and TEGa (tri-ethyl gallium) may be used as the source material of Ga. For example, TMIn (tri-methyl indium), TEIn (tri-ethyl indium), etc., may be used as the source material of In. For example, TMAl (tri-methyl aluminum), etc., may be used as the source material of Al. For example, $NH_3$ (ammonia), MMHy (monomethylhydrazine), DMHy (dimethyihydrazine), etc., may be used as the source material of N. $SiH_4$ (monosilane), (disilane), etc., may be used as the source material of Si.

A light emitting unit that emits light of a long wavelength may include a semiconductor other than a nitride semiconductor.

For example, the second light emitting unit 20 may include a GaP semiconductor. For example, the third semiconductor layer 21 may include n-type InAlP. For example, the second light emitting layer 23 may include GaAlP. For example, the fourth semiconductor layer 22 may include p-type InAlP.

Such semiconductor layers are formed by, for example, crystal growth by MOCVD, etc., on, for example, an n-type GaAs substrate. For example, an organic metal such as TMG, TMA, TMI, etc., and a hydrogenated gas such as arsine ($AsH_3$), phosphine ($PH_3$), etc., may be used to form such semiconductor layers. For example, Si is added to the n-type semiconductors; and, for example, Zn is added to the p-type semiconductors. For example, silane is used as the source material of Si. For example, dimethylzinc is used as the source material of Zn. Hydrogen or the like is used as the carrier gas.

In the formation of these semiconductor layers, a buffer layer is formed on a growth substrate; and the various semiconductor layers are formed on the buffer layer.

Figure 6:
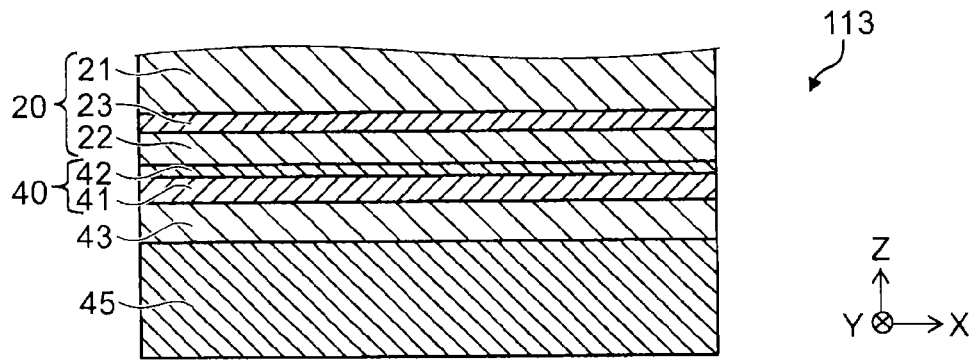
FIG. 6 is a schematic cross-sectional view illustrating another semiconductor light emitting element according to the first embodiment.

FIG. 6 is a schematic cross-sectional view illustrating another semiconductor light emitting element according to the first embodiment.

FIG. 6 shows an example of the light reflecting layer 40. The configurations of the light emitting units are the same as the configurations described above; and a description is therefore omitted. The first light emitting unit 10 and the third light emitting unit 30 are not shown in FIG. 6. In the example, the light reflecting layer 40 is electrically connected to the fourth semiconductor layer 22.

In the semiconductor light emitting element 113 according to the embodiment as shown in FIG. 6, the light reflecting layer 40 includes the reflective metal layer 41 and a light-transmissive electrically conductive film 42. The light-transmissive electrically conductive film 42 is disposed between the reflective metal layer 41 and the fourth semiconductor layer 22. The light-transmissive electrically conductive film 42 is light-transmissive to at least the second light. The light-transmissive electrically conductive film 42 contacts the fourth semiconductor layer 22. The light-transmissive electrically conductive film 42 is electrically conductive. The light-transmissive electrically conductive film 42 has an ohmic contact with the fourth semiconductor layer 22. The reflective metal layer 41 electrically contacts the light-transmissive electrically conductive film 42.

Thus, the light reflecting layer 40 may include a stacked film of the reflective metal layer 41 and the light-transmissive electrically conductive film 42. In the semiconductor light emitting element 113 as well, a highly efficient and practical semiconductor light emitting element that can obtain uniform polychromatic light can be provided. The stacked configurations of the light reflecting layers 40 of the semiconductor light emitting elements 110 to 112 and modifications of the semiconductor light emitting elements 110 to 112 are applicable to the semiconductor light emitting element 113.

Figure 7:
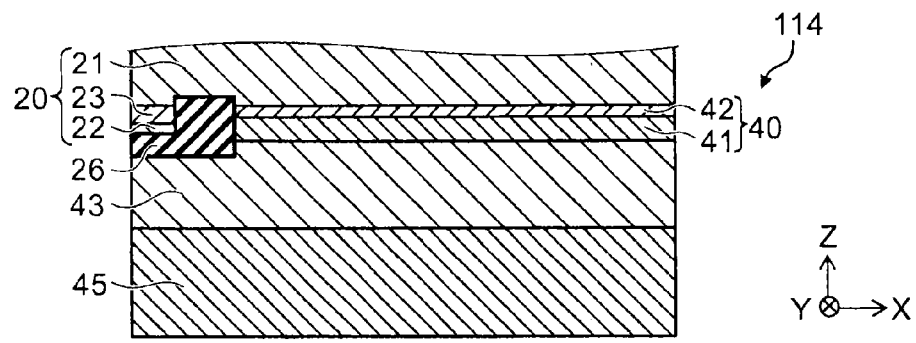
FIG. 7 is a schematic cross-sectional view illustrating another semiconductor light emitting element according to the first embodiment.

FIG. 7 is a schematic cross-sectional view illustrating another semiconductor light emitting element according to the first embodiment.

FIG. 7 shows an example of the light reflecting layer 40. The configurations of the light emitting units may be the same as the configurations described above; and a description is therefore omitted. The first light emitting unit 10 and the third light emitting unit 30 are not shown in FIG. 7. In the example, the light reflecting layer 40 is electrically connected to the third semiconductor layer 21.

As shown in FIG. 7, in the semiconductor light emitting element 114 according to the embodiment as well, the light reflecting layer 40 includes the reflective metal layer 41 and the light-transmissive electrically conductive film 42. The light-transmissive electrically conductive film 42 is disposed between the reflective metal layer 41 and the third semiconductor layer 21. The light-transmissive electrically conductive film 42 is light-transmissive to at least the second light. The light-transmissive electrically conductive film 42 contacts the third semiconductor layer 21. The light-transmissive electrically conductive film 42 is electrically conductive. The light-transmissive electrically conductive film 42 has an ohmic contact with the third semiconductor layer 21. The reflective metal layer 41 electrically contacts the light-transmissive electrically conductive film 42.

In the semiconductor light emitting element 114, an insulating layer 26 is provided between the fourth semiconductor layer 22 and the light reflecting layer 40 and between the second light emitting layer 23 and the light reflecting layer 40. The insulating layer 26 extends between the fourth semiconductor layer 22 and the support layer 43. The fourth semiconductor layer 22 and the second light emitting layer 23 are insulated from the support layer 43 (and the light reflecting layer 40) by the insulating layer 26.

In the semiconductor light emitting element 114 as well, a highly efficient and practical semiconductor light emitting element that can obtain uniform polychromatic light can be provided.

In the semiconductor light emitting elements 113 and 114, the reflective metal layer 41 may include at least one selected from silver, aluminum, and rhodium. The light-transmissive electrically conductive film 42 may include an oxide including at least one element selected from the group consisting of In, Sn, Zn, and Ti. The light-transmissive electrically conductive film 42 includes, for example, ITO. The thickness of the light-transmissive electrically conductive film 42 is, for example, not less than 0.1 μm and not more than 0.4 μm, e.g., about 0.2 μm.

An example of an electrode of the second light emitting unit 20 will now be described.

Figure 8:
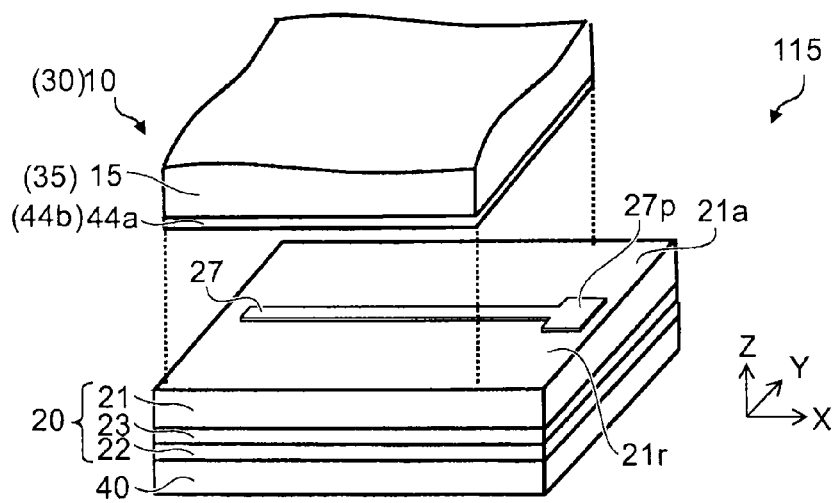
FIG. 8 is a schematic perspective view illustrating another semiconductor light emitting element according to the first embodiment.

FIG. 8 is a schematic perspective view illustrating another semiconductor light emitting element according to the first embodiment.

A portion of the first light emitting unit 10 and the third light emitting unit 30 is not shown in FIG. 8.

In the semiconductor light emitting element 115 according to the embodiment as shown in FIG. 8, the second light emitting unit 20 includes the third semiconductor-layer side electrode 27 and a third semiconductor-layer side pad unit 27p. The light reflecting layer 40 is electrically connected to the fourth semiconductor layer 22.

The third semiconductor-layer side electrode 27 is provided between the third semiconductor layer 21 and the first light transmitting layer 15. In the case where the third light emitting unit 30 is provided, the third semiconductor-layer side electrode 27 is provided between the third semiconductor layer 21 and the second light transmitting layer 35. The third semiconductor-layer side electrode 27 is electrically connected to the third semiconductor layer 21.

The third semiconductor-layer side pad unit 27p is provided on a surface 21a of the third semiconductor layer 21 on the first light transmitting layer 15 side. In the example, the third semiconductor-layer side pad unit 27p is provided on a portion 21r of the surface 21a not overlapping the first light transmitting layer 15 when projected onto the X-Y plane (a plane perpendicular to the stacking direction from the light reflecting layer 40 toward the first semiconductor layer 11). The third semiconductor-layer side pad unit 27p is electrically connected to the third semiconductor-layer side electrode 27.

In the example, the third semiconductor-layer side electrode 27 includes, for example, a metal film. In the example, the third semiconductor-layer side electrode 27 has a fine wire configuration extending from the third semiconductor-layer side pad unit 27p. The light absorption by the third semiconductor-layer side electrode 27 can be suppressed. The third semiconductor-layer side pad unit 27p does not overlap the first light transmitting layer 15 when projected onto the X-Y plane. For example, a wire or the like is connected to the third semiconductor-layer side pad unit 27p.

Figure 9:
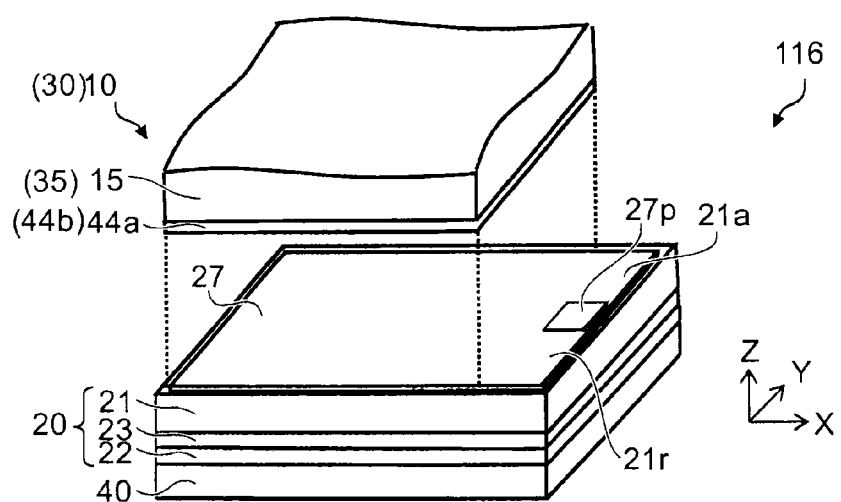
FIG. 9 is a schematic perspective view illustrating another semiconductor light emitting element according to the first embodiment.

FIG. 9 is a schematic perspective view illustrating another semiconductor light emitting element according to the first embodiment.

A portion of the first light emitting unit 10 and the third light emitting unit 30 is not shown in FIG. 9.

As shown in FIG. 9, in the semiconductor light emitting element 116 according to the embodiment as well, the third semiconductor-layer side electrode 27 and the third semiconductor-layer side pad unit 27p are provided. In such a case as well, the light reflecting layer 40 is electrically connected to the fourth semiconductor layer 22.

In the example, the third semiconductor-layer side electrode 27 includes an electrically conductive film that is light-transmissive. The third semiconductor-layer side electrode 27 has a large surface area. The light absorption by the third semiconductor-layer side electrode 27 can be suppressed. In the example as well, the third semiconductor-layer side pad unit 27p does not overlap the first light transmitting layer 15 when projected onto the X-Y plane. For example, a wire or the like is connected to the third semiconductor-layer side pad unit 27p.

In the semiconductor light emitting elements 115 and 116, the current that flows in the semiconductor layers of the second light emitting unit 20 flows mainly along the Z-axis direction. These semiconductor light emitting elements are vertical-conduction semiconductor light emitting elements.

FIG. 10A and FIG. 10B are schematic views illustrating another semiconductor light emitting element according to the first embodiment.

FIG. 10A is a schematic perspective view. FIG. 10B is a cross-sectional view along line A1-A2 of FIG. 10A. A portion of the first light emitting unit 10 and the third light emitting unit 30 is not shown in these drawings.

In the semiconductor light emitting element 117 according to the embodiment as shown in FIG. 10A and FIG. 10B, the second light emitting unit 20 includes the insulating layer 26, the third semiconductor-layer side electrode 27, and the third semiconductor-layer side pad unit 27p. The light reflecting layer 40 is electrically connected to the fourth semiconductor layer 22.

The insulating layer 26 has a portion 26a overlapping the first light transmitting layer 15 and a portion 26b not overlapping the first light transmitting layer 15 when projected onto the X-Y plane (the plane perpendicular to the stacking direction from the light reflecting layer 40 toward the first semiconductor layer 11).

The third semiconductor-layer side electrode 27 is provided between the third semiconductor layer 21 and the overlapping portion 26a of the insulating layer 26 recited above. The third semiconductor-layer side electrode 27 is electrically connected to the third semiconductor layer.

The third semiconductor-layer side pad unit 27p is provided on a surface 26bu of the not-overlapping portion 26b of the insulating layer 26 recited above on the first light transmitting layer 15 side. The third semiconductor-layer side pad unit 27p is electrically connected to the third semiconductor-layer side electrode 27.

The insulating layer 26 insulates the third semiconductor-layer side electrode 27 from the fourth semiconductor layer 22 and insulates the third semiconductor-layer side electrode 27 from the second light emitting layer 23.

FIG. 11A and FIG. 11B are schematic views illustrating another semiconductor light emitting element according to the first embodiment.

FIG. 11A is a schematic perspective view. FIG. 11B is a cross-sectional view along line B1-B2 of FIG. 11A. A portion of the first light emitting unit 10 and the third light emitting unit 30 is not shown in these drawings.

In the semiconductor light emitting element 118 according to the embodiment as shown in FIG. 11A and FIG. 11B, the second light emitting unit 20 includes the third semiconductor-layer side electrode 27, a fourth semiconductor-layer side pad unit 28p, and the insulating layer 26. In the example, the light reflecting layer 40 is electrically connected to the third semiconductor layer 21.

The third semiconductor-layer side electrode 27 is provided between the light reflecting layer 40 and the third semiconductor layer 21. The third semiconductor-layer side electrode 27 electrically connects the light reflecting layer 40 to the third semiconductor layer 21.

The fourth semiconductor layer 22 has a portion 22b not overlapping the first light transmitting layer 15 when projected onto the X-Y plane (the plane perpendicular to the stacking direction from the light reflecting layer 40 toward the first semiconductor layer 11). The fourth semiconductor-layer side pad unit 28p is provided on the not-overlapping portion 22b of the fourth semiconductor layer 22 recited above. The fourth semiconductor-layer side pad unit 28p is electrically connected to the fourth semiconductor layer 22.

The insulating layer 26 has a portion 26c that insulates the third semiconductor-layer side electrode 27 from the fourth semiconductor layer 22 and insulates the third semiconductor-layer side electrode 27 from the second light emitting layer 23. In the example, the insulating layer 26 further has a portion 26d that insulates the fourth semiconductor-layer side pad unit 28p from the third semiconductor layer 21 and insulates the fourth semiconductor-layer side pad unit 28p from the second light emitting layer 23.

In the semiconductor light emitting elements 117 and 118, the current that flows in the semiconductor layers of the second light emitting unit 20 flows, for example, through the third semiconductor layer 21 along the X-Y plane and along the Z-axis direction. These semiconductor light emitting elements are lateral-conduction semiconductor light emitting elements.

Second Embodiment

Figure 12:
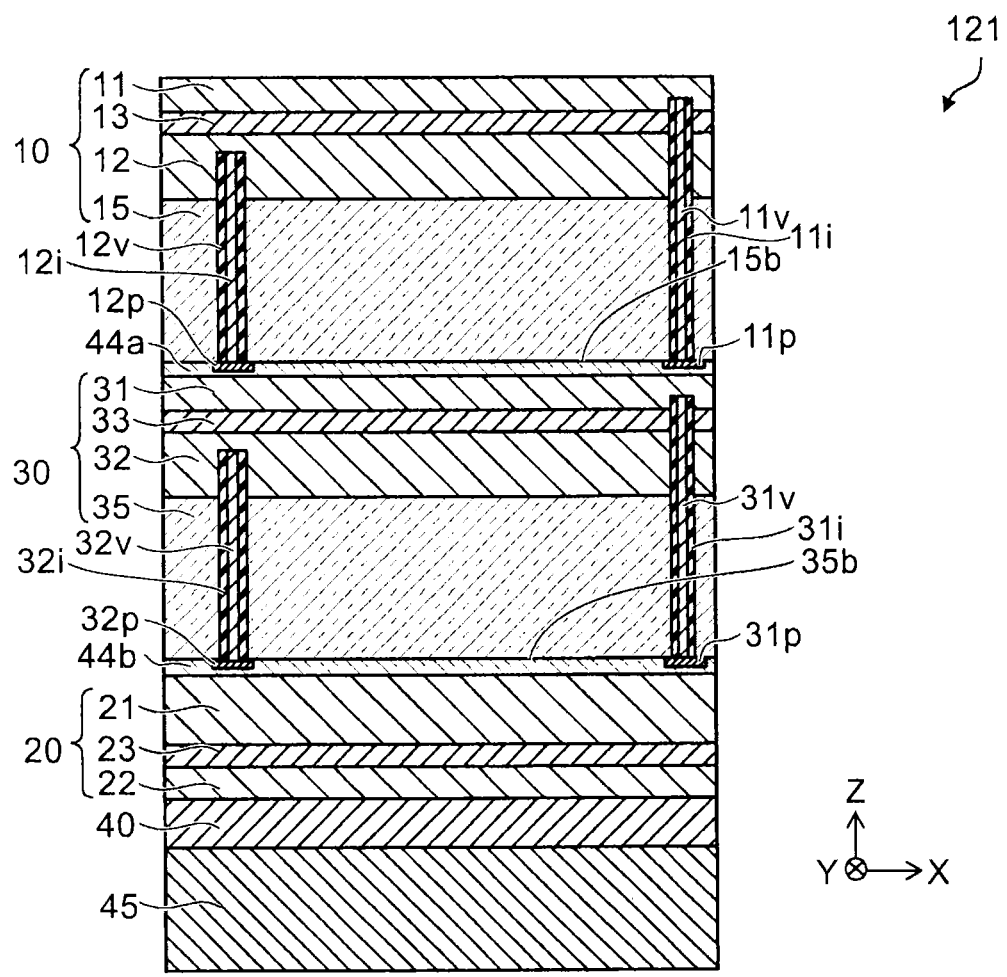
FIG. 12 is a schematic cross-sectional view illustrating a semiconductor light emitting element according to a second embodiment.

FIG. 12 is a schematic cross-sectional view illustrating a semiconductor light emitting element according to a second embodiment.

As shown in FIG. 12, the semiconductor light emitting element 121 according to the embodiment includes the light reflecting layer 40, the first light emitting unit 10, the second light emitting unit 20, and the third light emitting unit 30. Although the third light emitting unit 30 is provided in the example, the third light emitting unit 30 is provided if necessary and may be omitted. The configurations of the semiconductor layers and light emitting layers included in these light emitting units are similar to those described in regard to the first embodiment. The configurations that are added to the first embodiment will now be described.

In the example, the first light emitting unit 10 includes a first semiconductor layer through-electrode 11v and a first semiconductor layer insulating layer 11i. The first semiconductor layer through-electrode 11v pierces the second semiconductor layer 12, the first light emitting layer 13, and the first light transmitting layer 15 along the Z-axis direction (the direction from the light reflecting layer 40 toward the first semiconductor layer 11). The first semiconductor layer through-electrode 11v is electrically connected to the first semiconductor layer 11.

The first semiconductor layer insulating layer 11i is provided between the first semiconductor layer through-electrode 11v and the second semiconductor layer 12 and between the first semiconductor layer through-electrode 11v and the first light emitting layer 13. In the example, the first semiconductor layer insulating layer 11i is provided also between the first semiconductor layer through-electrode 11v and the first light transmitting layer 15.

In the example, the first light emitting unit 10 further includes a first semiconductor layer interconnect electrode 11p. The first semiconductor layer interconnect electrode 11p is provided at a surface 15b of the first light transmitting layer 15 on the second light emitting unit 20 side. The first semiconductor layer interconnect electrode 11p is electrically connected to the first semiconductor layer through-electrode 11v. For example, the surface area of the first semiconductor layer interconnect electrode 11p when projected onto the X-Y plane (the plane perpendicular to the stacking direction) is greater than the surface area of the first semiconductor layer through-electrode 11v when projected onto the X-Y plane. For example, the surface area of the first semiconductor layer interconnect electrode 11p when cut by the X-Y plane is greater than the surface area of the first semiconductor layer through-electrode 11v when cut by the X-Y plane.

In the example, the first light emitting unit 10 further includes a second semiconductor layer through-electrode 12v. The second semiconductor layer through-electrode 12v pierces the first light transmitting layer 15 along the Z-axis direction (the direction from the light reflecting layer 40 toward the first semiconductor layer 11). The second semiconductor layer through-electrode 12v is electrically connected to the second semiconductor layer 12.

A second semiconductor layer insulating layer 12i is further provided in the example. The second semiconductor layer insulating layer 12i is provided between the second semiconductor layer through-electrode 12v and the first light transmitting layer 15. The second semiconductor layer insulating layer 12i may be omitted.

In the example, the first light emitting unit 10 further includes a second semiconductor layer interconnect electrode 12p. The second semiconductor layer interconnect electrode 12p is provided at the surface 15b of the first light transmitting layer 15 on the second light emitting unit 20 side. The second semiconductor layer interconnect electrode 12p is electrically connected to the second semiconductor layer through-electrode 12v. For example, the surface area of the second semiconductor layer interconnect electrode 12p when projected onto the X-Y plane (the plane perpendicular to the stacking direction) is greater than the surface area of the second semiconductor layer through-electrode 12v when projected onto the X-Y plane. For example, the surface area of the second semiconductor layer interconnect electrode 12p when cut by the X-Y plane is greater than the surface area of the second semiconductor layer through-electrode 12v when cut by the X-Y plane.

In the example, the third light emitting unit 30 includes a fifth semiconductor layer through-electrode 31v and a fifth semiconductor layer insulating layer 31i. The fifth semiconductor layer through-electrode 31v pierces the sixth semiconductor layer 32, the third semiconductor layer 33, and the second light transmitting layer 35 along the Z-axis direction (the direction from the light reflecting layer 40 toward the first semiconductor layer 11). The fifth semiconductor layer through-electrode 31v is electrically connected to the fifth semiconductor layer 31.

The fifth semiconductor layer insulating layer 31i is provided between the fifth semiconductor layer through-electrode 31v and the sixth semiconductor layer 32 and between the fifth semiconductor layer through-electrode 31v and the third semiconductor layer 33. In the example, the fifth semiconductor layer insulating layer 31i is provided also between the fifth semiconductor layer through-electrode 31v and the second light transmitting layer 35.

In the example, the third light emitting unit 30 further includes a fifth semiconductor layer interconnect electrode 31p. The fifth semiconductor layer interconnect electrode 31p is provided at a surface 35b of the second light transmitting layer on the second light emitting unit 20 side. The fifth semiconductor layer interconnect electrode 31p is electrically connected to the fifth semiconductor layer through-electrode 31v. For example, the surface area of the fifth semiconductor layer interconnect electrode 31p when projected onto the X-Y plane (the plane perpendicular to the stacking direction) is greater than the surface area of the fifth semiconductor layer through-electrode 31v when projected onto the X-Y plane.

In the example, the third light emitting unit 30 further includes a sixth semiconductor layer through-electrode 32v. The sixth semiconductor layer through-electrode 32v pierces the second light transmitting layer 35 along the Z-axis direction (the direction from the light reflecting layer 40 toward the first semiconductor layer 11). The sixth semiconductor layer through-electrode 32v is electrically connected to the sixth semiconductor layer 32.

A sixth semiconductor layer insulating layer 32i is further provided in the example. The sixth semiconductor layer insulating layer 32i is provided between the sixth semiconductor layer through-electrode 32v and the second light transmitting layer 35. The sixth semiconductor layer insulating layer 32i may be omitted.

In the example, the third light emitting unit 30 further includes a sixth semiconductor layer interconnect electrode 32p. The sixth semiconductor layer interconnect electrode 32p is provided at the surface 35b of the second light transmitting layer 35 on the second light emitting unit 20 side. The sixth semiconductor layer interconnect electrode 32p is electrically connected to the sixth semiconductor layer through-electrode 32v. For example, the surface area of the sixth semiconductor layer interconnect electrode 32p when projected onto the X-Y plane (the plane perpendicular to the stacking direction) is greater than the surface area of the sixth semiconductor layer through-electrode 32v when projected onto the X-Y plane.

In the semiconductor light emitting element 121, the through-electrodes that are connected to the semiconductor layers of the first light emitting unit 10 are drawn to the lower surface (the surface 15b) of the first light transmitting layer 15. The through-electrodes that are connected to the semiconductor layers of the third light emitting unit 30 are drawn to the lower surface (the surface 35b) of the second light transmitting layer 35. In the semiconductor light emitting element 121, the mounting of the interconnects is easier. Further, the element can be downsized.

Figure 13:
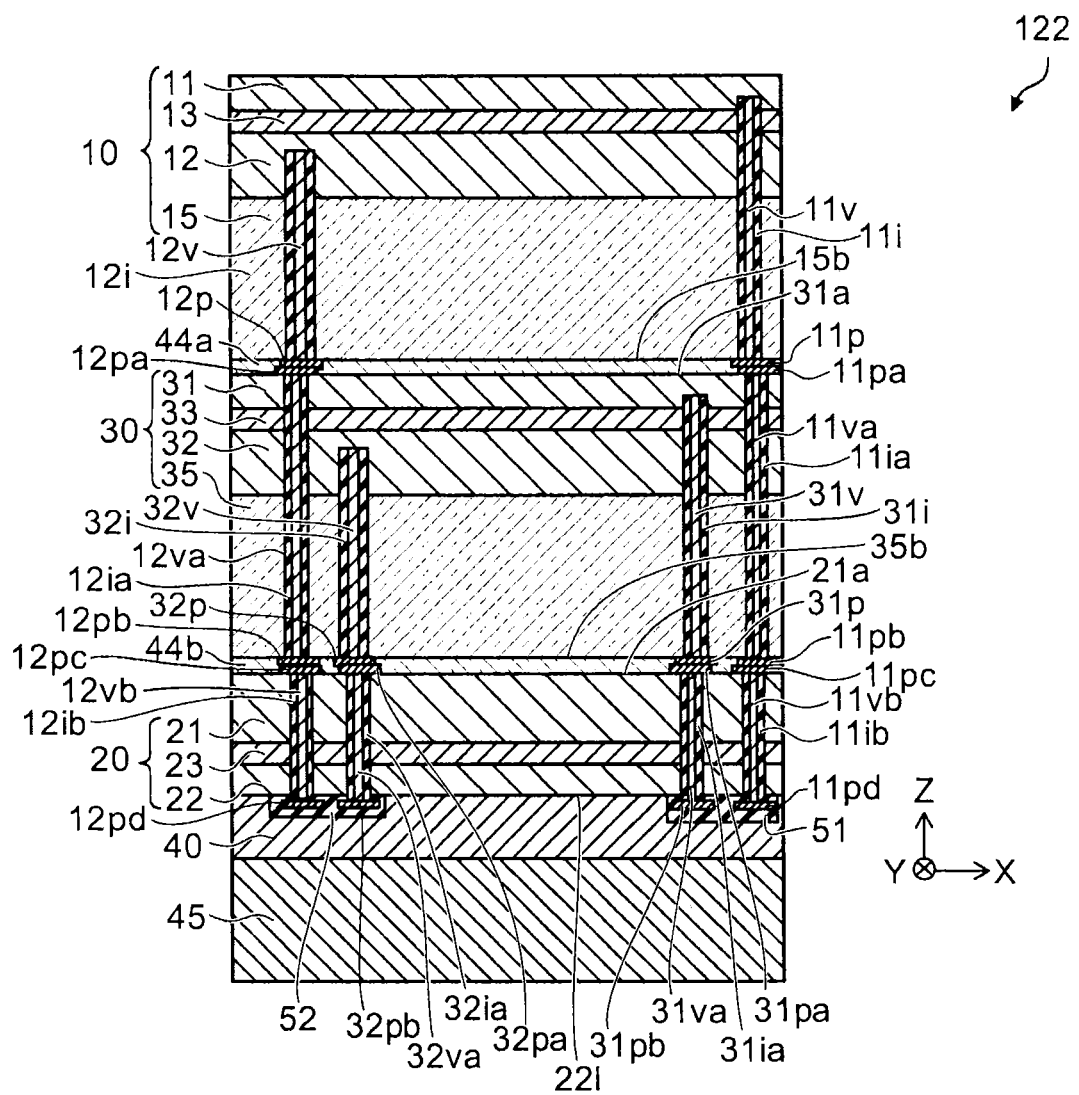
FIG. 13 is a schematic cross-sectional view illustrating another semiconductor light emitting element according to the second embodiment.

FIG. 13 is a schematic cross-sectional view illustrating another semiconductor light emitting element according to the second embodiment. In the semiconductor light emitting element 122 according to the embodiment as shown in FIG. 13, the through-electrodes that are provided in the first light emitting unit 10 are electrically drawn to a surface 22a of the second light emitting unit 20 on the light reflecting layer 40 side by the through-electrodes provided in the third light emitting unit 30 and the through-electrodes provided in the second light emitting unit 20. Also, the through-electrodes that are provided in the third light emitting unit 30 are electrically drawn to the surface 22a of the second light emitting unit 20 on the light reflecting layer 40 side by the through-electrodes provided in the second light emitting unit 20.

In the example, a through-electrode 11va and an insulating layer 11ia are provided in the third light emitting unit 30. The through-electrode 11va pierces the fifth semiconductor layer 31, the third light emitting layer 33, the sixth semiconductor layer 32, and the second light transmitting layer 35 along the Z-axis direction. The through-electrode 11va is electrically connected to the first semiconductor layer through-electrode 11v via the first semiconductor layer interconnect electrode 11p and an interconnect electrode 11pa. The interconnect electrode 11pa is provided at a surface 31a of the fifth semiconductor layer 31 on the first light transmitting layer 15 side. The interconnect electrode 11pa is electrically connected to the first semiconductor layer interconnect electrode 11p. The insulating layer 11ia is provided between the through-electrode 11va and the fifth semiconductor layer 31, between the through-electrode 11va and the third light emitting layer 33, and between the through-electrode 11va and the sixth semiconductor layer 32.

Further, a through-electrode 12va and an insulating layer 12ia are provided in the third light emitting unit 30. The through-electrode 12va pierces the fifth semiconductor layer 31, the third light emitting layer 33, the sixth semiconductor layer 32, and the second light transmitting layer 35 along the Z-axis direction. The through-electrode 12va is electrically connected to the second semiconductor layer through-electrode 12v via the second semiconductor layer interconnect electrode 12p and an interconnect electrode 12pa. The interconnect electrode 12pa is provided at the surface 31a of the fifth semiconductor layer 31 on the first light transmitting layer 15 side. The interconnect electrode 12pa is electrically connected to the second semiconductor layer interconnect electrode 12p. The insulating layer 12ia is provided between the through-electrode 12va and the fifth semiconductor layer 31, between the through-electrode 12va and the third light emitting layer 33, and between the through-electrode 12va and the sixth semiconductor layer 32.

On the other hand, a through-electrode 11vb and an insulating layer nib are provided in the second light emitting unit 20. The through-electrode 11vb pierces the third semiconductor layer 21, the second light emitting layer 23, and the fourth semiconductor layer 22 along the Z-axis direction. The through-electrode 11vb is electrically connected to the through-electrode 11va via an interconnect electrode 11pb and an interconnect electrode 11pc. In other words, the through-electrode 11vb is electrically connected to the first semiconductor layer through-electrode 11v. The interconnect electrode 11pb is provided at the surface 35b of the second light transmitting layer 35 on the second light emitting unit 20 side. The interconnect electrode 11pc is provided at the surface 21a of the third semiconductor layer 21 on the first light transmitting layer 15 side. The interconnect electrode 11pb is electrically connected to the interconnect electrode 11pc. The insulating layer 11ib is provided between the through-electrode 11vb and the third semiconductor layer 21, between the through-electrode 11vb and the second light emitting layer 23, and between the through-electrode 11vb and the fourth semiconductor layer 22.

The second light emitting unit 20 further includes a through-electrode 12vb and an insulating layer 12ib. The through-electrode 12vb pierces the third semiconductor layer 21, the second light emitting layer 23, and the fourth semiconductor layer 22 along the Z-axis direction. The through-electrode 12vb is electrically connected to the through-electrode 12va via an interconnect electrode 12pb and an interconnect electrode 12pc. In other words, the through-electrode 12vb is electrically connected to the second semiconductor layer through-electrode 12v. The interconnect electrode 12pb is provided at the surface 35b of the second light transmitting layer 35 on the second light emitting unit 20 side. The interconnect electrode 12pc is provided at the surface 21a of the third semiconductor layer 21 on the first light transmitting layer 15 side. The interconnect electrode 12pb is electrically connected to the interconnect electrode 12pc. The insulating layer 12ib is provided between the through-electrode 12vb and the third semiconductor layer 21, between the through-electrode 12vb and the second light emitting layer 23, and between the through-electrode 12vb and the fourth semiconductor layer 22.

In the example, the second light emitting unit 20 includes a through-electrode 31va and an insulating layer 31ia. The through-electrode 31va pierces the third semiconductor layer 21, the second light emitting layer 23, and the fourth semiconductor layer 22 along the Z-axis direction. The through-electrode 31va is electrically connected to the fifth semiconductor layer through-electrode 31v via the fifth semiconductor layer interconnect electrode 31p and an interconnect electrode 31pa. The interconnect electrode 31pa is provided at the surface 21a of the third semiconductor layer 21 on the first light transmitting layer 15 side. The interconnect electrode 31pa is electrically connected to the fifth semiconductor layer interconnect electrode 31p. An insulating layer 31ib is provided between the through-electrode 31va and the third semiconductor layer 21, between the through-electrode 31va and the second light emitting layer 23, and between the through-electrode 31va and the fourth semiconductor layer 22.

The second light emitting unit 20 further includes a through-electrode 32va and an insulating layer 32ia. The through-electrode 32va pierces the third semiconductor layer 21, the second light emitting layer 23, and the fourth semiconductor layer 22 along the Z-axis direction. The through-electrode 32va is electrically connected to the sixth semiconductor layer through-electrode 32v via the sixth semiconductor layer interconnect electrode 32p and an interconnect electrode 32pa. The interconnect electrode 32pa is provided at the surface 21a of the third semiconductor layer 21 on the first light transmitting layer 15 side. The interconnect electrode 32pa is electrically connected to the sixth semiconductor layer interconnect electrode 32p. The insulating layer 32ia is provided between the through-electrode 32va and the third semiconductor layer 21, between the through-electrode 32va and the second light emitting layer 23, and between the through-electrode 32va and the fourth semiconductor layer 22.

In the example, interconnect electrodes 11pd, 12pd, 31pb, and 32pb are provided at a surface 221 of the fourth semiconductor layer 22 on the light reflecting layer 40 side. The interconnect electrode 11pd electrically contacts the through-electrode 11vb. The interconnect electrode 12pd electrically contacts the through-electrode 12vb. The interconnect electrode 31pb electrically contacts the through-electrode 31va. The interconnect electrode 32pb electrically contacts the through-electrode 32va. The surface area of the interconnect electrodes when projected onto the X-Y plane is greater than the surface area of the through-electrodes.

In the example, an insulating layer 51 is provided between the interconnect electrode 11pd and the light reflecting layer 40 and between the interconnect electrode 31pb and the light reflecting layer 40. An insulating layer 52 is provided between the interconnect electrode 12pd and the light reflecting layer 40 and between the interconnect electrode 32pb and the light reflecting layer 40.

For example, the surface area of the interconnect electrodes when projected onto the X-Y plane (the plane perpendicular to the stacking direction) is greater than the surface area of the through-electrodes when projected onto the X-Y plane. Thereby, the through-electrodes of the stacked light emitting units are easily connected to each other even in the case where shift occurs when the light emitting units are stacked.

The various through-electrodes recited above include, for example, at least one selected from Cu (copper), W (tungsten), Au (gold), and Si (e.g., polysilicon). The insulating layers include an oxide (e.g., silicon oxide), a nitride (e.g., silicon nitride), silicon oxynitride, etc. The interconnect electrodes include, for example, at least one selected from Cu, W, Au, and Si (e.g., polysilicon). In the embodiment, the interconnect electrodes are provided if necessary and may be omitted.

Figure 14:
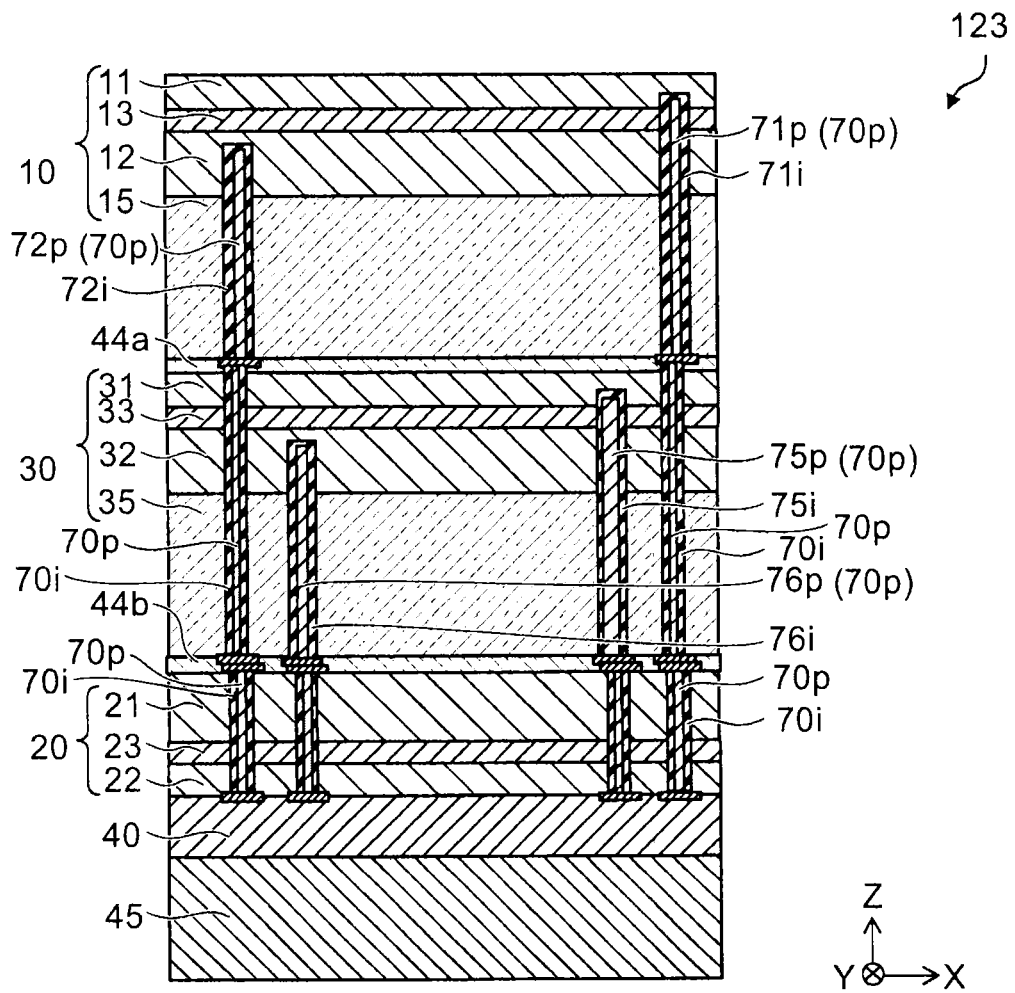
FIG. 14 is a schematic cross-sectional view illustrating another semiconductor light emitting element according to the second embodiment.

FIG. 14 is a schematic cross-sectional view illustrating another semiconductor light emitting element according to the second embodiment. As shown in FIG. 14, the semiconductor light emitting element 123 according to the embodiment includes thermally conductive pillars 70p.

The thermally conductive pillars 70p pierce at least portions of the light emitting units along the Z-axis direction to conduct the heat that is generated at the light emitting units toward, for example, the heat-dissipating member 45. Pillar insulating layers 70i are provided between the thermally conductive pillars 70p and the semiconductor layers.

In the example, the first light emitting unit 10 includes a second semiconductor layer thermally conductive pillar 72p and a second semiconductor layer pillar insulating layer 72i.

The second semiconductor layer thermally conductive pillar 72p pierces the first light transmitting layer 15 along the Z-axis direction (the direction from the light reflecting layer 40 toward the first semiconductor layer 11). The second semiconductor layer thermally conductive pillar 72p is insulated from at least the second semiconductor layer 12. The second semiconductor layer pillar insulating layer 72i has a portion provided at least between the second semiconductor layer thermally conductive pillar 72p and the second semiconductor layer 12.

In the example, the first light emitting unit 10 further includes a first semiconductor layer thermally conductive pillar 71p and a first semiconductor layer pillar insulating layer 71i. The first semiconductor layer thermally conductive pillar 71p pierces the first light emitting layer 13, the second semiconductor layer 12, and the first light transmitting layer 15 along the Z-axis direction. The first semiconductor layer thermally conductive pillar 71p is insulated from at least the first semiconductor layer 11, the first light emitting layer 13, and the second semiconductor layer 12. The first semiconductor layer pillar insulating layer 71i has a portion provided at least between the first semiconductor layer thermally conductive pillar 71p and the first semiconductor layer 11.

On the other hand, the third light emitting unit 30 further includes a sixth semiconductor layer thermally conductive pillar 76p and a sixth semiconductor layer pillar insulating layer 76i. The sixth semiconductor layer thermally conductive pillar 76p pierces the second light transmitting layer 35 along the Z-axis direction (the direction from the light reflecting layer 40 toward the first semiconductor layer 11) and is insulated from at least the sixth semiconductor layer 32. The sixth semiconductor layer pillar insulating layer 76i has a portion provided at least between the sixth semiconductor layer thermally conductive pillar 76p and the sixth semiconductor layer 32.

In the example, the third light emitting unit 30 further includes a fifth semiconductor layer thermally conductive pillar 75p and a fifth semiconductor layer pillar insulating layer 75i. The fifth semiconductor layer thermally conductive pillar 75p pierces the third light emitting layer 33, the sixth semiconductor layer 32, and the second light transmitting layer 35 along the Z-axis direction. The fifth semiconductor layer thermally conductive pillar 75p is insulated from at least the fifth semiconductor layer 31, the third light emitting layer 33, and the sixth semiconductor layer 32. The fifth semiconductor layer pillar insulating layer 75i has a portion provided at least between the fifth semiconductor layer thermally conductive pillar 75p and the fifth semiconductor layer 31.

In the example, the thermally conductive pillars 70p recited above that are provided in the first light emitting unit 10 are connected to the thermally conductive pillars 70p provided in the third light emitting unit 30. Then, the thermally conductive pillars 70p that are provided in the third light emitting unit 30 are connected to the light reflecting layer 40 by the thermally conductive pillars 70p provided in the second light emitting unit 20. The light reflecting layer 40 is connected to the heat-dissipating member 45.

The heat that is generated at the light emitting units is conducted efficiently toward the light reflecting layer 40 (the heat-dissipating member 45) via the thermally conductive pillars 70p. Thereby, the heat dissipation improves; and a higher efficiency is obtained.

The thermally conductive pillars 70p may include the materials described in regard to the through-electrodes. The pillar insulating layers 70i may include the materials described in regard to the insulating layers used with the through-electrodes.

The thermally conductive pillars 70p and the pillar insulating layers 70i recited above may be provided with the through-electrodes, insulating layers, and interconnect electrodes described in regard to the semiconductor light emitting elements 121 and 122.

A reflective layer opposing the side surface of the semiconductor layer also may be provided in the semiconductor light emitting elements according to the first and second embodiments recited above. Thereby, the light that is emitted from the side surface of the semiconductor layer is reflected upward; and a high efficiency is obtained. Further, the directivity of the light that is emitted can be controlled.

Third Embodiment

The embodiment relates to a method for manufacturing one selected from the semiconductor light emitting elements according to the first embodiment and the second embodiment and the modifications of the semiconductor light emitting elements according to the first embodiment and the second embodiment.

Figure 15:
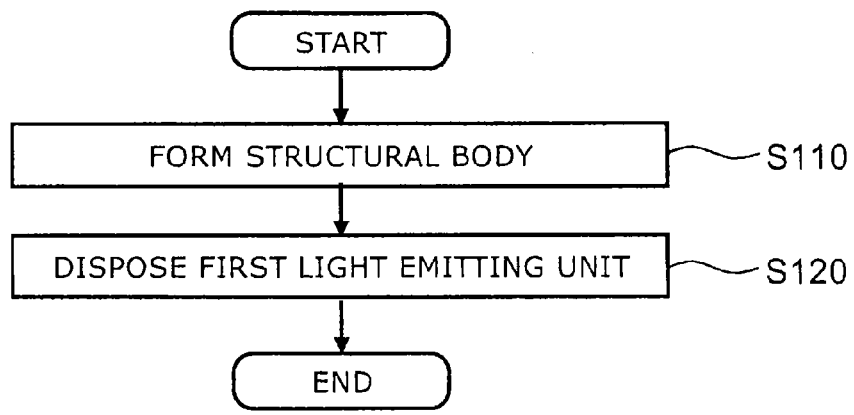
FIG. 15 is a flowchart illustrating the method for manufacturing the semiconductor light emitting element according to the third embodiment.

FIG. 15 is a flowchart illustrating the method for manufacturing the semiconductor light emitting element according to the third embodiment.

Figure 16A:
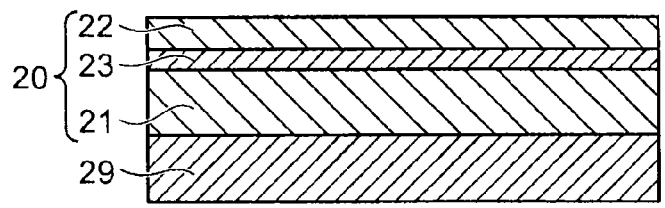
FIG. 16A and FIG. 16B are schematic cross-sectional views illustrating a portion of the method for manufacturing the semiconductor light emitting element according to the third embodiment.
Figure 16B:
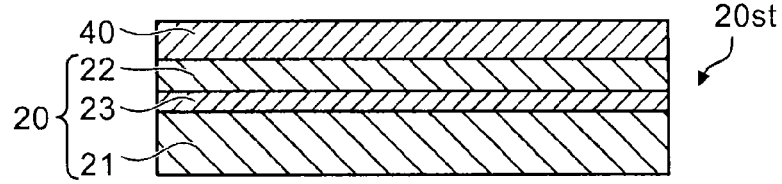

FIG. 16A and FIG. 16B are schematic cross-sectional views illustrating a portion of the method for manufacturing the semiconductor light emitting element according to the third embodiment.

In the manufacturing method as shown in FIG. 15, a structural body that includes the light reflecting layer 40 and the second light emitting unit 20 recited above is formed (step S110).

In this process as shown in FIG. 16A, the third semiconductor layer 21, the second light emitting layer 23, and the fourth semiconductor layer 22 are formed by sequentially performing crystal growth on a second light emitting unit growth substrate 29.

As shown in FIG. 16B, the light reflecting layer 40 is provided on the fourth semiconductor layer 22; and the second light emitting unit growth substrate 29 is removed. Thereby, a structural body 20st that includes the light reflecting layer 40 and the second light emitting unit 20 is formed.

As shown in FIG. 15, the first light emitting unit 10 is disposed on the third semiconductor layer 21 of the structural body 20st (step S120). The first light emitting unit 10 is formed by, for example, sequentially performing crystal growth of the second semiconductor layer 12, the first light emitting layer 13, and the first semiconductor layer 11 on the first light transmitting layer 15 (e.g., a sapphire substrate or a GaN substrate).

According to the manufacturing method, a method for manufacturing a highly efficient and practical semiconductor light emitting element that can obtain uniform polychromatic light can be provided.

According to the embodiments, a highly efficient and practical semiconductor light emitting element that can obtain uniform polychromatic light and a method for manufacturing the semiconductor light emitting element can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the semiconductor light emitting element such as the light reflecting layer, the heat-dissipating member, the light emitting unit, the semiconductor layer, the light emitting layer, the light transmitting layer, the metal layer, the light-transmissive electrically conductive film, the insulating layer, the through-electrode, the interconnect electrode, the thermally conductive pillar, etc., from known art; and such practice is within the scope of the invention to the extent that similar effects are obtained.

Further, any two or more components of the specific examples may be combined within the extent of technical feasibility and are included in the scope of the invention to the extent that the purport of the invention is included.

Moreover, all semiconductor light emitting elements and methods for manufacturing the same practicable by an appropriate design modification by one skilled in the art based on the semiconductor light emitting elements and methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting element, comprising:
   a light reflecting layer;
   a first light emitting unit including
      a first semiconductor layer,
      a second semiconductor layer provided between the first semiconductor layer and the light reflecting layer, a conductivity type of the second semiconductor layer being different from a conductivity type of the first semiconductor layer,
      a first light emitting layer provided between the first semiconductor layer and the second semiconductor layer, the first light emitting layer being configured to emit a first light of a first peak wavelength, and
      a first light transmitting layer provided between the second semiconductor layer and the light reflecting layer, the first light transmitting layer being light-transmissive to the first light; and a second light emitting unit including
a third semiconductor layer provided between the first light transmitting layer and the light reflecting layer,
a fourth semiconductor layer provided between the third semiconductor layer and the light reflecting layer, a conductivity type of the fourth semiconductor layer being different from a conductivity type of the third semiconductor layer, and
a second light emitting layer provided between the third semiconductor layer and the fourth semiconductor layer, the second light emitting layer being configured to emit a second light of a second peak wavelength different from the first peak wavelength;
the light reflecting layer being electrically connected to one selected from the third semiconductor layer and the fourth semiconductor layer,
a thickness of the first light transmitting layer being not less than 10 times a distance between the second light emitting layer and the light reflecting layer,
wherein the element emits a portion of the first light from a first side surface of the first light transmitting layer, and
the first side surface of the first light transmitting layer crosses a plane perpendicular to a direction from the light reflecting layer toward the first semiconductor layer.

2. The element according to claim 1, wherein the first light transmitting layer is a sapphire substrate or a GaN substrate.

3. The element according to claim 1, wherein the first peak wavelength is shorter than the second peak wavelength.

4. The element according to claim 1, further comprising:
a third light emitting unit, the third light emitting unit including:
a fifth semiconductor layer provided between the first light transmitting layer and the third semiconductor layer;
a sixth semiconductor layer provided between the fifth semiconductor layer and the third semiconductor layer, a conductivity type of the sixth semiconductor layer being different from a conductivity type of the fifth semiconductor layer;
a third light emitting layer provided between the fifth semiconductor layer and the sixth semiconductor layer, the third light emitting layer being configured to emit a third light of a third peak wavelength different from the first peak wavelength and different from the second peak wavelength; and
a second light transmitting layer provided between the sixth semiconductor layer and the third semiconductor layer, the second light transmitting layer being light-transmissive to the third light,
a thickness of the second light transmitting layer being not less than 10 times the distance between the second light emitting layer and the light reflecting layer.

5. The element according to claim 4, wherein the element is configured to emit a portion of the third light from a side surface of the second light transmitting layer.

6. The element according to claim 4, wherein the second light transmitting layer is a sapphire substrate or a GaN substrate.

7. The element according to claim 4, wherein the third peak wavelength is between the first peak wavelength and the second peak wavelength.

8. The element according to claim 4, wherein the third light emitting unit further includes:
a fifth semiconductor layer through-electrode piercing the sixth semiconductor layer, the second light emitting layer, and the second light transmitting layer along a stacking direction from the light reflecting layer toward the first semiconductor layer to be electrically connected to the fifth semiconductor layer; and
a fifth semiconductor layer insulating layer provided between the fifth semiconductor layer through-electrode and the sixth semiconductor layer and between the fifth semiconductor layer through-electrode and the second light emitting layer.

9. The element according to claim 4, wherein the third light emitting unit further includes:
a sixth semiconductor layer thermally conductive pillar piercing the second light transmitting layer along a stacking direction from the light reflecting layer toward the first semiconductor layer to be insulated from at least the sixth semiconductor layer; and
a sixth semiconductor layer pillar insulating layer having a portion provided at least between the sixth semiconductor layer thermally conductive pillar and the sixth semiconductor layer.

10. The element according to claim 1, wherein
the second light emitting unit further includes
a third semiconductor-layer side electrode provided between the third semiconductor layer and the first light transmitting layer to be electrically connected to the third semiconductor layer, and
a third semiconductor-layer side pad unit provided on a portion of a surface of the third semiconductor layer on the first light transmitting layer side not overlapping the first light transmitting layer when projected onto a plane perpendicular to a stacking direction from the light reflecting layer toward the first semiconductor layer, the third semiconductor-layer side pad unit being electrically connected to the third semiconductor-layer side electrode, and
the light reflecting layer being electrically connected to the fourth semiconductor layer.

11. The element according to claim 1, wherein
the second light emitting unit further includes:
an insulating layer having a portion overlapping the first light transmitting layer and a portion not overlapping the first light transmitting layer when projected onto a plane perpendicular to a stacking direction from the light reflecting layer toward the first semiconductor layer;
a third semiconductor-layer side electrode provided between the overlapping portion and the third semiconductor layer to be electrically connected to the third semiconductor layer; and
a third semiconductor-layer side pad unit provided on a surface of the not-overlapping portion on the first light transmitting layer side to be electrically connected to the third semiconductor-layer side electrode,
the insulating layer insulates the third semiconductor-layer side electrode from the fourth semiconductor layer and insulates the third semiconductor-layer side electrode from the second light emitting layer, and
the light reflecting layer is electrically connected to the fourth semiconductor layer.

12. The element according to claim 1, wherein the second light emitting unit further includes:
a third semiconductor-layer side electrode provided between the light reflecting layer and the third semiconductor layer to electrically connect the light reflecting layer to the third semiconductor layer;
a fourth semiconductor-layer side pad unit provided on a portion of the fourth semiconductor layer not overlapping the first light transmitting layer when projected onto a plane perpendicular to a stacking direction from the light reflecting layer toward the first semiconductor layer, the fourth semiconductor-layer side pad unit being electrically connected to the fourth semiconductor layer; and an insulating layer configured to insulate the third semiconductor-layer side electrode from the fourth semiconductor layer and insulate the third semiconductor-layer side electrode from the second light emitting layer.

13. The element according to claim 1, wherein
the light reflecting layer includes a reflective metal layer having an ohmic contact with the one selected from the third semiconductor layer and the fourth semiconductor layer, and
the reflective metal layer includes at least one selected from silver, aluminum, and rhodium.

14. The element according to claim 1, wherein the light reflecting layer includes:
 a reflective metal layer including at least one selected from silver, aluminum, and rhodium; and
 a light-transmissive electrically conductive film provided between the reflective metal layer and the fourth semiconductor layer, the light-transmissive electrically conductive film being light-transmissive to the second light and having an ohmic contact with the one selected from the third semiconductor layer and the fourth semiconductor layer.

15. The element according to claim 1, further comprising a support layer,
 the light reflecting layer being disposed between the support layer and the second semiconductor layer,
 a thermal conductivity of the support layer being higher than a thermal conductivity of the first light transmitting layer.

16. The element according to claim 1, wherein the first light emitting unit further includes:

a first semiconductor layer through-electrode piercing the second semiconductor layer, the first light emitting layer, and the first light transmitting layer along a stacking direction from the light reflecting layer toward the first semiconductor layer to be electrically connected to the first semiconductor layer; and a first semiconductor layer insulating layer provided between the first semiconductor layer through-electrode and the second semiconductor layer and between the first semiconductor layer through-electrode and the first light emitting layer.

17. The element according to claim 16, wherein
the first light emitting unit further includes a first semiconductor layer interconnect electrode provided on a surface of the first light transmitting layer on the second light emitting unit side to be electrically connected to the first semiconductor layer through-electrode, and
a surface area of the first semiconductor layer interconnect electrode when projected onto a plane perpendicular to the stacking direction is greater than a surface area of the first semiconductor layer through-electrode when projected onto the plane.

18. The element according to claim 1, wherein the first light emitting unit further includes:
 a second semiconductor layer thermally conductive pillar piercing the first light transmitting layer along a stacking direction from the light reflecting layer toward the first semiconductor layer to be insulated from at least the second semiconductor layer; and
 a second semiconductor layer pillar insulating layer having a portion provided at least between the second semiconductor layer thermally conductive pillar and the second semiconductor layer.

* * * * *